(12) United States Patent
Kim

(10) Patent No.: US 8,942,268 B2
(45) Date of Patent: Jan. 27, 2015

(54) SILICON-BASED COOLING APPARATUS FOR LASER GAIN MEDIUM

(71) Applicant: Gerald Ho Kim, Carlsbad, CA (US)

(72) Inventor: Gerald Ho Kim, Carlsbad, CA (US)

( * ) Notice: Subject to any disclaimer, the term of this patent is extended or adjusted under 35 U.S.C. 154(b) by 0 days.

(21) Appl. No.: 14/270,255

(22) Filed: May 5, 2014

(65) Prior Publication Data

US 2014/0269798 A1    Sep. 18, 2014

Related U.S. Application Data

(63) Continuation-in-part of application No. 13/842,849, filed on Mar. 15, 2013, now Pat. No. 8,755,418.

(51) Int. Cl.
*H01S 3/04* (2006.01)
*H01S 5/024* (2006.01)

(52) U.S. Cl.
CPC ............. *H01S 5/02423* (2013.01); *H01S 5/024* (2013.01)
USPC .................................. 372/35; 372/34; 372/36

(58) Field of Classification Search
CPC ......... H01S 3/04; H01S 3/0407; H01S 5/024; H01S 5/02423
USPC ...................................................... 372/33–36
See application file for complete search history.

*Primary Examiner* — Armando Rodriguez

(57) ABSTRACT

Embodiments of silicon-based thermal energy transfer apparatus for a gain medium of a laser system are provided. In one aspect, a silicon-based thermal energy transfer apparatus includes silicon-based first and second manifolds each having internal coolant flow channels therein. When the first and second manifolds are coupled together, a first groove on the first manifold and a second groove on the second manifold form a through hole configured to receive the gain medium therein. The through hole has a polygonal cross section when viewed along a longitudinal axis of the gain medium.

20 Claims, 14 Drawing Sheets

SILICON-BASED COOLING APPARATUS FOR LASER GAIN MEDIUM

CROSS REFERENCE TO RELATED PATENT APPLICATIONS

This is a Continuation-in-Part of U.S. patent application Ser. No. 13/842,849, filed on Mar. 15, 2013, which is a Divisional of U.S. patent application Ser. No. 13/286,992, filed on Nov. 1, 2011 and issued as U.S. Pat. No. 8,514,901 on Aug. 20, 2013, which claims the priority benefit of U.S. Patent Application No. 61/409,211, filed on Nov. 2, 2010. The aforementioned applications are hereby incorporated by reference in their entirety.

TECHNICAL FIELD

The present disclosure generally relates to the field of transfer of thermal energy and, more particularly, to removal of thermal energy from a gain medium of a laser system.

BACKGROUND

In general, a laser system is constructed with three main parts including an energy source, a laser medium, and two or more mirrors that form an optical resonator. The energy source of a laser system is also known as the pump source, and is the part that provides energy to the laser system.

The laser medium of a laser system is also known as the gain medium, and is the major determining factor of various properties of the laser system including the wavelength of operation. The gain medium is excited by the pump source to produce a population inversion. The gain medium is also where spontaneous emission of photons and stimulated emission of photons take place that lead to the phenomenon of optical gain, or amplification. Gain media are generally made of liquids, gases, solids, or semiconductors. The solids used as gain media typically include crystals and glasses, and may be doped with an impurity such as chromium, neodymium, erbium, or titanium ions. As the gain medium is excited to emit photons, a large amount of thermal energy is generated by the gain medium. Such thermal energy needs to be removed from the gain medium, by a cooling apparatus for example, in order to prolong the lifetime of the gain medium as well as keep the laser system within normal operating parameters.

The optical resonator consists of two or more mirrors placed around the gain medium to provide feedback of the light. Light from spontaneous emission of the gain medium is reflected by the mirrors back into the gain medium, where the light may be amplified by stimulated emission. The light may be reflected from the mirrors and thus pass through the gain medium hundreds of times before exiting the gain medium. The design and alignment of the mirrors with respect to the gain medium is crucial to determining the exact operating wavelength and other properties of the laser system.

In applications where the laser system needs to be compact, one or more laser diodes may be used as the energy source given the small form factor of laser diodes. The gain media in such a laser system correspondingly tends to have small form factor as well. However, conventional metal-based cooling apparatus made of copper, aluminum or a type of metal alloy tend to suffer from corrosion and clogging of coolant channel, if liquid is used as a heat transfer medium. Additionally, at very high temperature the metal may deform if the temperature approaches the melting temperature of the metal.

SUMMARY

In one aspect, a thermal energy transfer apparatus that removes thermal energy from a gain medium of a laser system may include silicon-based first and second manifolds. The first manifold may include first internal coolant flow channels therein. The first manifold may include a first primary side and a second primary side opposite the first primary side with the first internal coolant flow channels fluidly connect the first primary side and the second primary side of the first manifold. The second primary side of the first manifold may include a first groove. The second manifold may include second internal coolant flow channels therein. The second manifold may include a first primary side and a second primary side opposite the first primary side with the second internal coolant flow channels fluidly connecting the first primary side and the second primary side of the second manifold. The second primary side of the second manifold may include a second groove. When the first manifold and the second manifold are coupled together with the second primary side of the first manifold facing the second primary side of the second manifold, a first through hole configured to receive the gain medium may be formed between the first manifold and the second manifold. The first through hole may have a polygonal cross section when viewed along a longitudinal axis of the gain medium.

In some embodiments, the first internal coolant flow channels in the first manifold and the second internal coolant flow channels in the second manifold may be configures such that, when the gain medium is received in the first through hole between the first manifold and the second manifold, the gain medium is surrounded by the first internal coolant flow channels and the second internal coolant flow channels when viewed along the longitudinal axis of the gain medium.

In some embodiments, at least three locations on the gain medium may be in physical contact with the first manifold and the second manifold when the gain medium is received in the first through hole.

In some embodiments, the first through hole may have a generally hexagonal cross section when viewed along the longitudinal axis of the gain medium.

In some embodiments, the apparatus may further include a first conduit element and a second conduit element. The first and second conduit elements may be coupled between the first manifold and the second manifold to provide flow paths for a coolant to flow from the second manifold to the first manifold. When the first conduit element and the second conduit element are coupled between the first manifold and the second manifold with the second primary side of the first manifold facing the second primary side of the second manifold, a second through hole configured to receive the gain medium may be formed between the first manifold, the second manifold, the first conduit element and the second conduit element. The second through hole may have a polygonal cross section when viewed along a longitudinal axis of the gain medium.

In some embodiments, at least one of the first conduit element or the second conduit element may be made of a metal-based or ceramic material.

In some embodiments, the second through hole may have a generally octagonal cross section when viewed along the longitudinal axis of the gain medium.

In some embodiments, the apparatus may further include a layer of synthetic diamond between and in contact with the first manifold and the gain medium. The apparatus may additionally include a layer of synthetic diamond between and in contact with the second manifold and the gain medium.

In some embodiments, the apparatus may further include a plurality of nanotubes between and in contact with the first manifold and the gain medium. The apparatus may additionally include a plurality of nanotubes between and in contact with the second manifold and the gain medium.

In some embodiments, the apparatus may further include an outbound coolant tubing, a first adapter, an inbound coolant tubing, and a second adapter. The outbound coolant tubing may be made of a metallic or ceramic material. The first adapter may be made of a metallic or ceramic material, and may include a first side and a second side. The first side of the first adapter may be coupled to the first manifold. The second side of the first adapter may be coupled to the outbound coolant tubing. The first adapter may include an internal coolant flow channel that allows the coolant to flow from the first manifold to the outbound coolant tubing through the first adapter. The inbound coolant tubing may be made of a metallic or ceramic material. The second adapter may be made of a metallic or ceramic material, and may include a first side and a second side. The first side of the second adapter may be coupled to the second manifold. The second side of the second adapter may be coupled to the inbound coolant tubing. The second adapter may include an internal coolant flow channel that allows the coolant to flow from the inbound coolant tubing to the second manifold through the second adapter.

In some embodiments, the apparatus may further include a heat exchanger system coupled to the outbound coolant tubing and the inbound coolant tubing. The heat exchanger system may supply the coolant to the inbound coolant tubing and receiving the coolant from the outbound coolant tubing to remove thermal energy from the coolant.

In some embodiments, the apparatus may further include a coolant supplier and a coolant receiver. The coolant supplier may be coupled to the inbound coolant tubing to supply the coolant at a first temperature range. The coolant receiver may be coupled to the outbound coolant tubing to receive the coolant at a second temperature range that is higher than the temperature range.

In some embodiments, the apparatus may further include the gain medium which may be a right circular cylinder-shaped crystal or an optical fiber.

In some embodiments, the apparatus may further include a filler material with high thermal conduction that fills a gap of space between the gain medium, the first manifold and the second manifold.

In another aspect, a thermal energy transfer apparatus that removes thermal energy from a gain medium of a laser system may include silicon-based first and second manifolds. The first manifold may include first internal coolant flow channels therein. The first manifold may include a first primary side and a second primary side opposite the first primary side with the first internal coolant flow channels fluidly connect the first primary side and the second primary side of the first manifold. The second primary side of the first manifold may include a first groove. The second manifold may include second internal coolant flow channels therein. The second manifold may include a first primary side and a second primary side opposite the first primary side with the second internal coolant flow channels fluidly connecting the first primary side and the second primary side of the second manifold. The second primary side of the second manifold may include a second groove. When the first manifold and the second manifold are coupled together with the second primary side of the first manifold facing the second primary side of the second manifold, a first through hole configured to receive the gain medium may be formed between the first manifold and the second manifold. The first internal coolant flow channels in the first manifold and the second internal coolant flow channels in the second manifold may surround the first through hole.

In some embodiments, at least three locations on the gain medium may be in physical contact with the first manifold and the second manifold when the gain medium is received in the first through hole.

In some embodiments, the first through hole may have a generally hexagonal cross section when viewed along the longitudinal axis of the gain medium.

In some embodiments, the apparatus may further include a first conduit element and a second conduit element. The first and second conduit elements may be coupled between the first manifold and the second manifold to provide flow paths for a coolant to flow from the second manifold to the first manifold. When the first conduit element and the second conduit element are coupled between the first manifold and the second manifold with the second primary side of the first manifold facing the second primary side of the second manifold, a second through hole configured to receive the gain medium may be formed between the first manifold, the second manifold, the first conduit element and the second conduit element. The second through hole may have a generally octagonal cross section when viewed along a longitudinal axis of the gain medium.

In some embodiments, at least one of the first conduit element or the second conduit element may be made of a metal-based or ceramic material.

In some embodiments, the apparatus may further include a layer of synthetic diamond between and in contact with the gain medium and either or both of the first manifold and the second manifold. Alternatively, the apparatus may further include a plurality of nanotubes between and in contact with the gain medium and either or both of the first manifold and the second manifold.

In some embodiments, the apparatus may further include an outbound coolant tubing, a first adapter, an inbound coolant tubing and a second adapter. The outbound coolant tubing may be made of a metallic or ceramic material. The first adapter may be made of a metallic or ceramic material. The first adapter may include a first side and a second side. The first side of the first adapter may be coupled to the first manifold. The second side of the first adapter may be coupled to the outbound coolant tubing. The first adapter may include an internal coolant flow channel that allows the coolant to flow from the first manifold to the outbound coolant tubing through the first adapter. The inbound coolant tubing may be made of a metallic or ceramic material. The second adapter may be made of a metallic or ceramic material. The second adapter may include a first side and a second side. The first side of the second adapter may be coupled to the second manifold. The second side of the second adapter may be coupled to the inbound coolant tubing. The second adapter may include an internal coolant flow channel that allows the coolant to flow from the inbound coolant tubing to the second manifold through the second adapter.

In some embodiments, the apparatus may further include a heat exchanger system coupled to the outbound coolant tubing and the inbound coolant tubing. The heat exchanger system may supply the coolant to the inbound coolant tubing and receiving the coolant from the outbound coolant tubing to remove thermal energy from the coolant.

In some embodiments, the apparatus may further include a coolant supplier coupled to the inbound coolant tubing to supply the coolant at a first temperature range. The apparatus may additionally include a coolant receiver coupled to the outbound coolant tubing to receive the coolant at a second temperature range that is higher than the temperature range.

In some embodiments, the apparatus may further include the gain medium which is a right circular cylinder-shaped crystal or an optical fiber.

In some embodiments, the apparatus may further include a filler material with high thermal conduction that fills a gap of space between the gain medium, the first manifold and the second manifold.

This summary is provided to introduce concepts relating to heat removal from laser gain medium using silicon-based thermal energy transfer apparatus. These techniques are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

The present disclosure describes embodiments of silicon-based thermal energy transfer techniques for a gain medium of a laser system such as, for example, crystal or optical fiber. Various embodiments of silicon-based thermal energy transfer apparatus are configured with internal coolant flow channels that surround a cavity in which the gain medium is received. The cavity has a polygonal cross section when viewed along a longitudinal axis of the gain medium. Multiple points, lines or locations of the gain medium are in direct or physical contact with surfaces of the cavity of the silicon-based thermal energy transfer apparatus. Thus, thermal energy, or heat, in the gain medium can be transferred out of the gain medium to the coolant, flowing in the internal coolant channels, through the multiple contact points, lines or locations between the gain medium and the cavity of the silicon-based thermal energy transfer apparatus.

While aspects of described techniques relating to silicon-based thermal energy transfer apparatuses for laser gain media can be implemented in any number of different laser systems, embodiments are described in context of the following exemplary configurations.

Illustrative First Thermal Energy Transfer Apparatus

Figure 1:
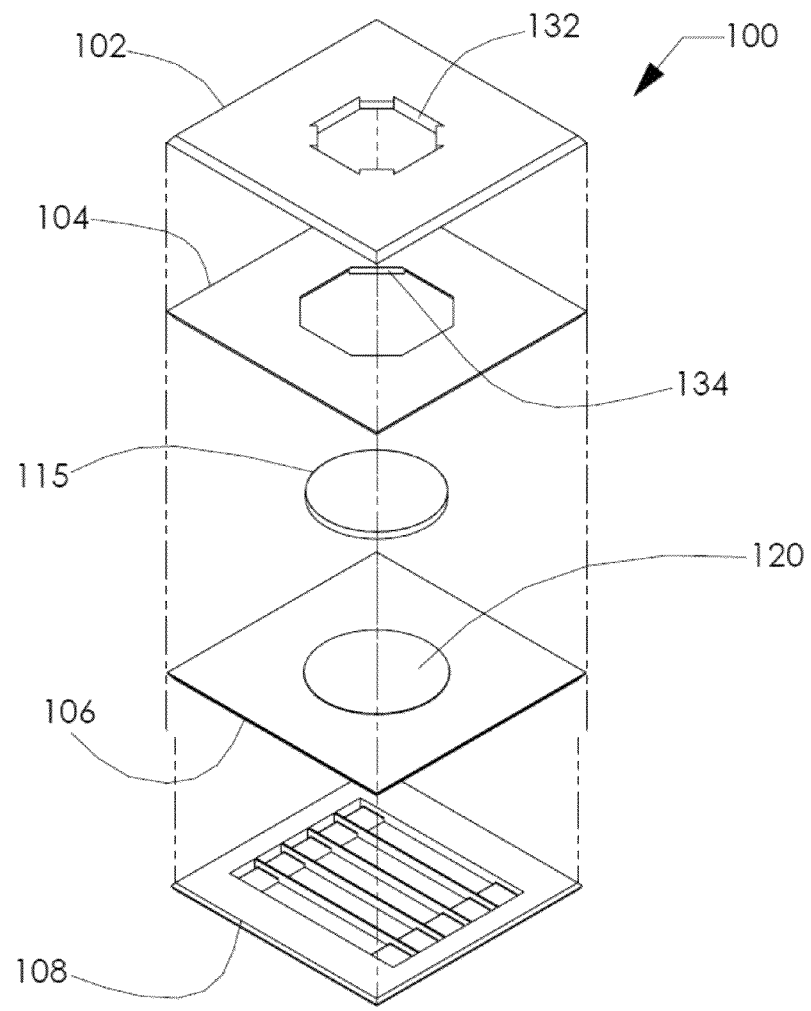
FIG. 1 illustrates a first silicon-based thermal energy transfer device for a disk-shaped gain medium of a laser system in accordance with one non-limiting embodiment.
Figure 1:
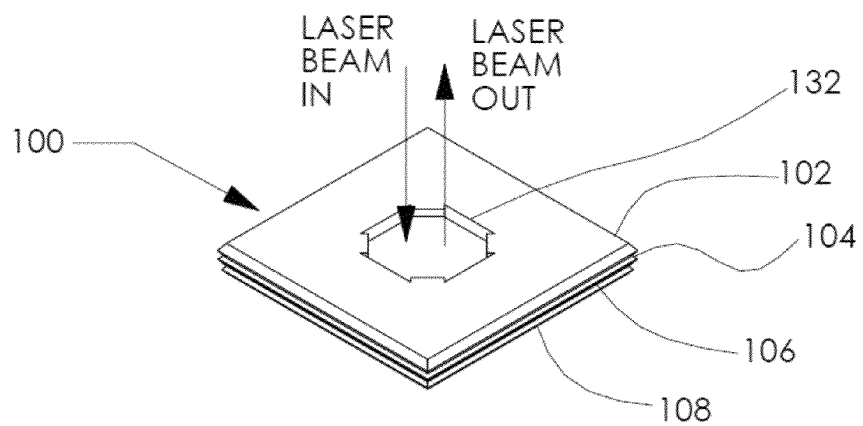
Figure 2:
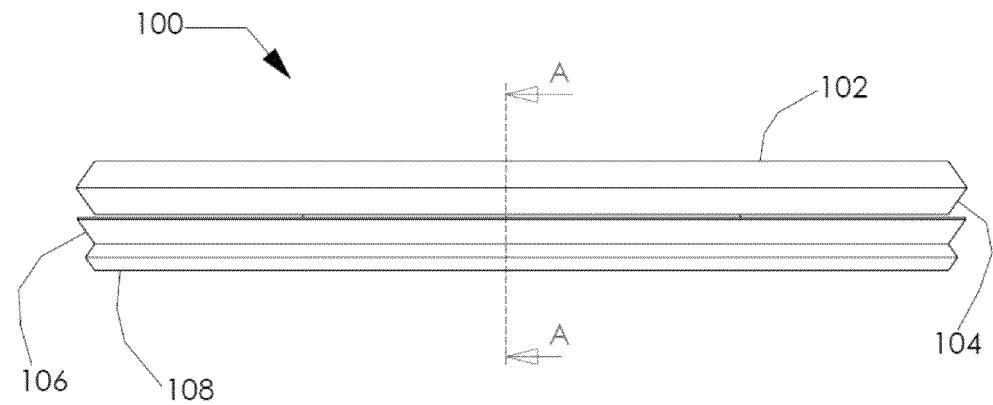
FIG. 2 illustrates a side view and a cross-sectional view of the silicon-based thermal energy transfer device of FIG. 1.
Figure 2:
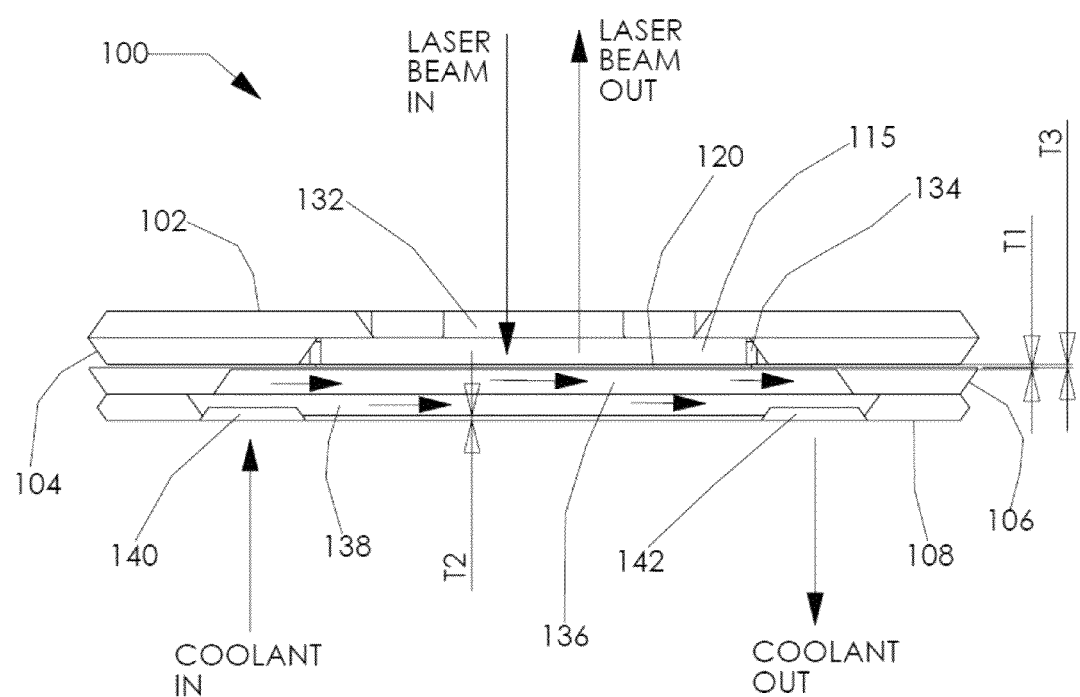
Figure 3:
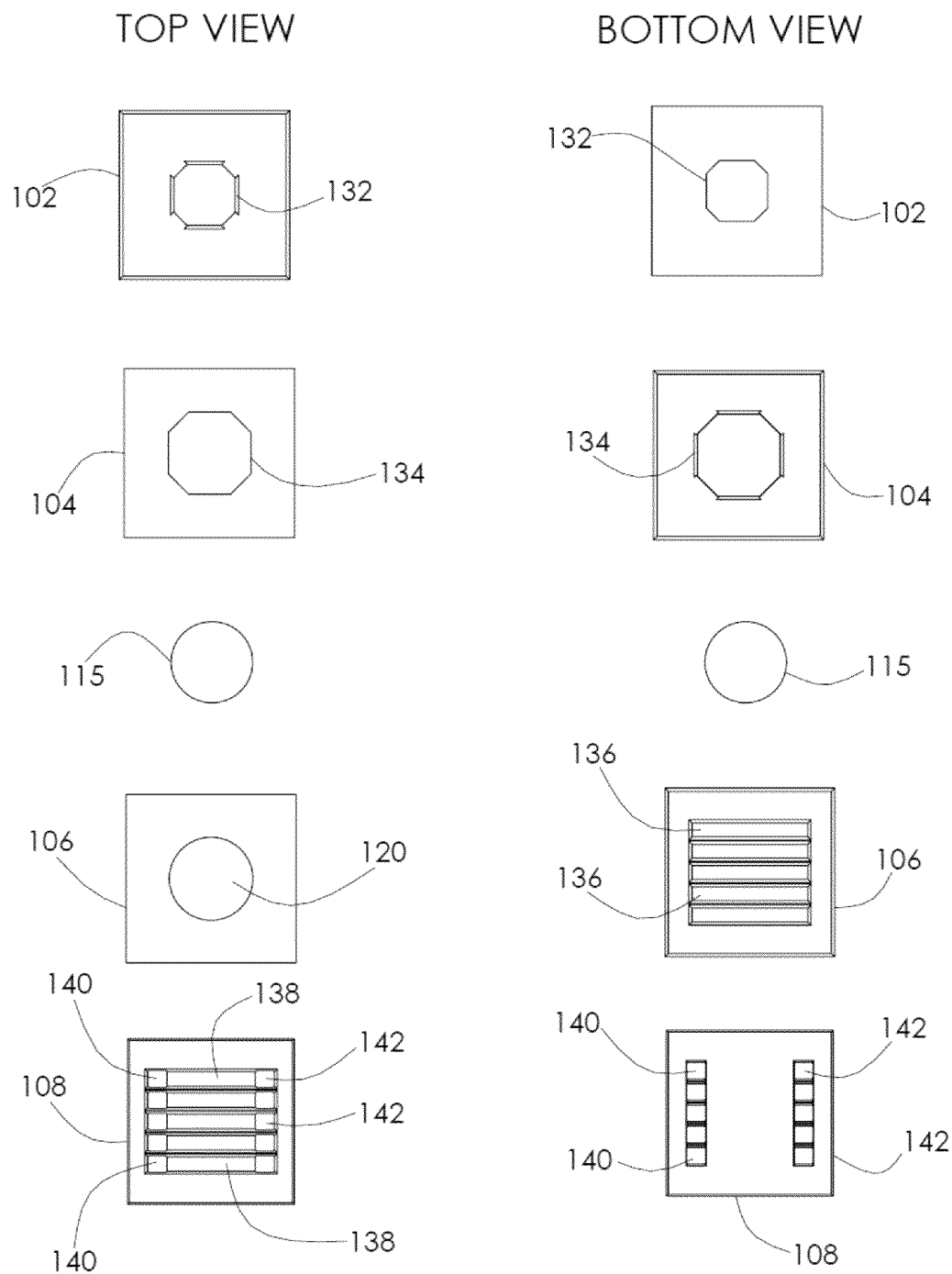
FIG. 3 illustrates a top view and a bottom view of the silicon-based thermal energy transfer device of FIG. 1.

FIGS. 1-3 illustrate various views of a silicon-based thermal energy transfer device 100 for a disk-shaped gain medium 115 of a laser system in accordance with one non-limiting embodiment. Gain medium 115 may be a crystal. The device 100 includes a first plate 102, a second plate 104, a first half structure 108, and a second half structure 106. Each of the first plate 102, second plate 104, first half structure 108, and second half structure 106 is made of silicon, e.g., single-crystal silicon. In one embodiment, each of the first plate 102, second plate 104, first half structure 108, and second half structure 106 is deposited with a combination of layer of metals such as, for example, Cr/Au, TiW/Ni/Au or TiW/Au. In one embodiment, each of the first plate 102, second plate 104, first half structure 108, and second half structure 106 is fabricated from a respective silicon wafer using semiconductor fabrication technology including photolithography, dry etch, wet etch, etc.

The first plate 102 has an opening 132. The opening 132 has an area that is smaller than the area of either of the two primary surfaces of the gain medium 115. In one embodiment, the opening 132 is approximately octagon-shaped as shown in FIG. 1. In other embodiments, the opening 132 may have one of other shapes such as a circular shape or another polygonal shape.

The second plate 104 has an opening 134. The opening 134 has an area that is slightly larger than the area of either of the two primary surfaces of the gain medium 115. The opening 134 is shaped so that, when the gain medium 115 is placed within the opening 134, the opening 134 at least partially circumscribes the gain medium 115 with the gain medium 115 contacting a plurality of points of the opening 134. In one embodiment, the opening 134 is approximately octagon-shaped as shown in FIG. 1. In other embodiment, the opening 134 may have one of other polygonal shapes.

The first half structure 108 has a first row of openings 140 as coolant inlet ports and a second row of openings 142 as coolant outlet ports. As shown in FIG. 3, on one of the two primary surfaces of the first half structure 108, there are grooves 138 each of which connecting a respective pair of one of the openings 140 and one of the openings 142.

The second half structure 106 also has a plurality of grooves 136 on one of its two primary surfaces. Each of the grooves 136 corresponds to a respective one of the grooves 138 such that when the first half structure 108 and the second half structure 106 are bonded together to form a manifold, the grooves 136 and the grooves 138 form internal coolant flow channels for a coolant flowing in through the openings 140 to flow out through the openings 142. The primary surface of the second half structure 106 opposite the primary surface that has the grooves 136 is substantially flat to provide surface area to contact with the corresponding primary surface of the gain medium 115.

In one embodiment, the thinnest part of the second half structure 106 where the grooves 136 are, denoted as thickness T1 in FIG. 2, is approximately in a range of 50 μm to 100 um. In one embodiment, the thinnest part of the first half structure 108 where the grooves 138 are, denoted as thickness T2 in FIG. 2, is approximately in a range of 100 μm to 200 um.

As shown in FIGS. 1 and 2, the first plate 102 and the second plate 104 together form a cover element. The first half structure 108 and the second half structure 106 together form a manifold. The first plate 102 and the second plate 104 may be affixed to each other by solder or silicon-to-silicon bonding. The first half structure 108 and the second half structure 106 may be affixed to each other by solder or silicon-to-silicon bonding. In one embodiment, the cover element formed by the first plate 102 and the second plate 104 and the manifold formed by the first half structure 108 and the second half structure 106 are soldered together. That is, the primary surface of the second plate 104 facing the second half structure 106 is soldered to the primary surface of the second half structure 106 facing the second plate 104.

In various embodiments, a layer of thermally-conductive material 120 is coated on at least the side of the manifold formed by the first half structure 108 and the second half structure 106 that faces the cover element formed by the first plate 102 and the second plate 104. In one embodiment, the layer of thermally-conductive material 120 has a thickness, denoted as thickness T3 in FIG. 2, of approximately in a range of 25 to 300 μm. When the gain medium 115 is mounted between the cover element formed by the first plate 102 and the second plate 104 and the manifold formed by the first half structure 108 and the second half structure 106, the primary surface of the gain medium 115 that is not exposed is in direct contact with the layer of thermally-conductive material 120. The layer of thermally-conductive material 120 needs to have good conductive thermal efficiency to maximize thermal energy in the gain medium 115 to be transferred to the second half structure 106. The layer of thermally-conductive material 120 also relieves the thermal stress between the gain medium 115 and the second half structure 106 when there is a temperature differential between the gain medium 115 and the second half structure 106. In one embodiment, the layer of thermally-conductive material 120 is a layer of synthetic diamond. The layer of synthetic diamond may be of black color (with thermal conductivity of 800 to 1200 W-deg/m) or, alternatively, translucent color (with thermal conductivity of 1200 to 2000 W-deg/m). In another embodiment, the layer of thermally-conductive material 120 includes a plurality of nanotubes. The nanotubes need not be in any particular orientation or arrangement as the nanotubes serve as a gap or space filler in addition to aiding heat transfer.

As shown in FIGS. 1 and 2, when the disk-shaped gain medium 115 is mounted between the cover element formed by the first plate 102 and the second plate 104 and the manifold formed by the first half structure 108 and the second half structure 106, a portion but not all of a primary surface of the gain medium 115 is exposed. With one primary surface of the gain medium 115 exposed to a laser beam and the opposite primary surface of the gain medium 115 in direct contact with the layer of thermally-conductive material 120 coated on the second half structure 106, the laser beam is refracted a number of times, and thereby being amplified, within the gain medium 115 before a laser beam with increased energy is reflected out of the gain medium 115 as shown in FIG. 1.

Figure 10:
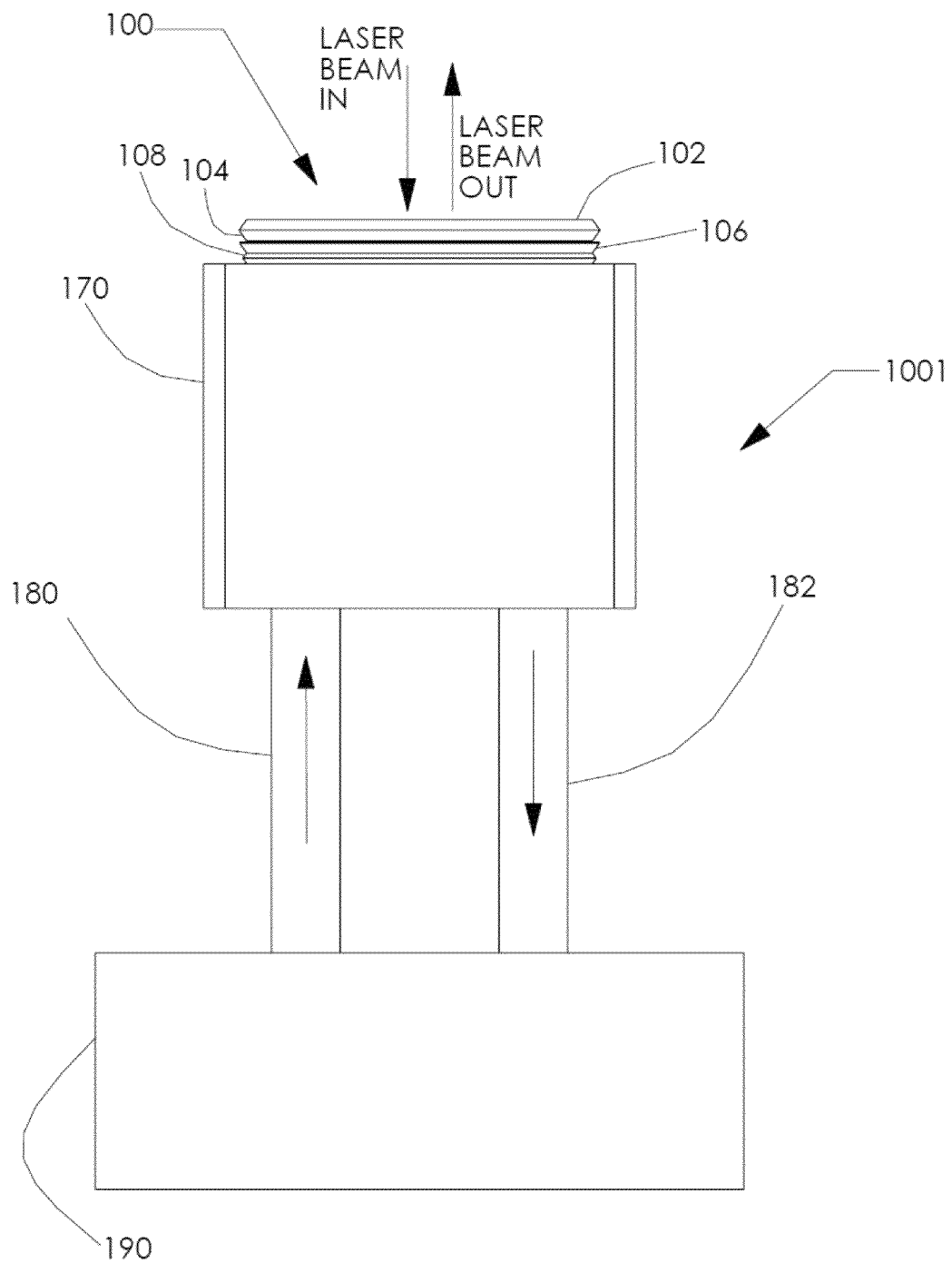
FIG. 10 illustrates a first thermal energy transfer apparatus that includes the silicon-based thermal energy transfer device of FIGS. 1-3 in accordance with one non-limiting embodiment.

FIG. 10 illustrates a thermal energy transfer apparatus 1001 that includes the silicon-based thermal energy transfer device 100 in accordance with one non-limiting embodiment. The apparatus 1001 includes an inbound coolant tubing 180, an outbound coolant tubing 182, an adapter 170, and a heat exchanger system 190.

The adapter 170 has a first side coupled to the first side of the first half structure 108 that has the openings 140 and 142, and a second side coupled to the inbound coolant tubing 180 and the outbound coolant tubing 182. The adapter 170 has an inbound coolant flow channel (not shown) to allow the coolant to flow from the inbound coolant tubing 180 to the manifold formed by the half structures 106 and 108 through the adapter 170. The adapter also has an outbound coolant flow channel (not shown) to allow the coolant to flow from the manifold formed by the half structures 106 and 108 to the outbound coolant tubing 182 through the adapter 170.

The heat exchanger system 190 is coupled to the outbound coolant tubing 182 and the inbound coolant tubing 180. The heat exchanger system 190 supplies the coolant to the inbound coolant tubing 180 and receives the coolant from the outbound coolant tubing 182 to remove thermal energy from the coolant. In one embodiment, the coolant is de-ionized water. In other embodiments, the coolant may be other suitable fluid such as, for example, distilled water, water-alcohol mixture, or water-glycol mixture.

Each of the inbound coolant tubing 180, outbound coolant tubing 182, and adapter 170 is respectively made of a non-corrosive material. In one embodiment, each of the inbound coolant tubing 180 and outbound coolant tubing 182 is respectively made of stainless steel, a nickel-plated metallic material, a gold-plated metallic material, or a ceramic material. In one embodiment, the adapter 170 is made of a ceramic material. The materials that the inbound coolant tubing 180, outbound coolant tubing 182, and adapter 170 are made of cannot be plastics or any material subject to corrosion when exposed to water. Chemicals leaching out of plastics or particles coming off of a material due to corrosion, when any of the inbound coolant tubing 180, outbound coolant tubing 182, or adapter 170 is made of plastics or a corrosive material, will likely foul or clog up the internal coolant flow channels of the manifold formed by the first half structure 108 and second half structure 106 as well as the heat exchanger system 190.

In one embodiment, the inbound coolant tubing 180 and the outbound coolant tubing 182 are coupled to the adapter 170 by solder, press-fit, epoxy bonding, or single-body machined. In one embodiment, the adapter 170 is coupled to the second half structure 108 by solder or epoxy bonding.

Illustrative Second Thermal Energy Transfer Apparatus

Figure 4:
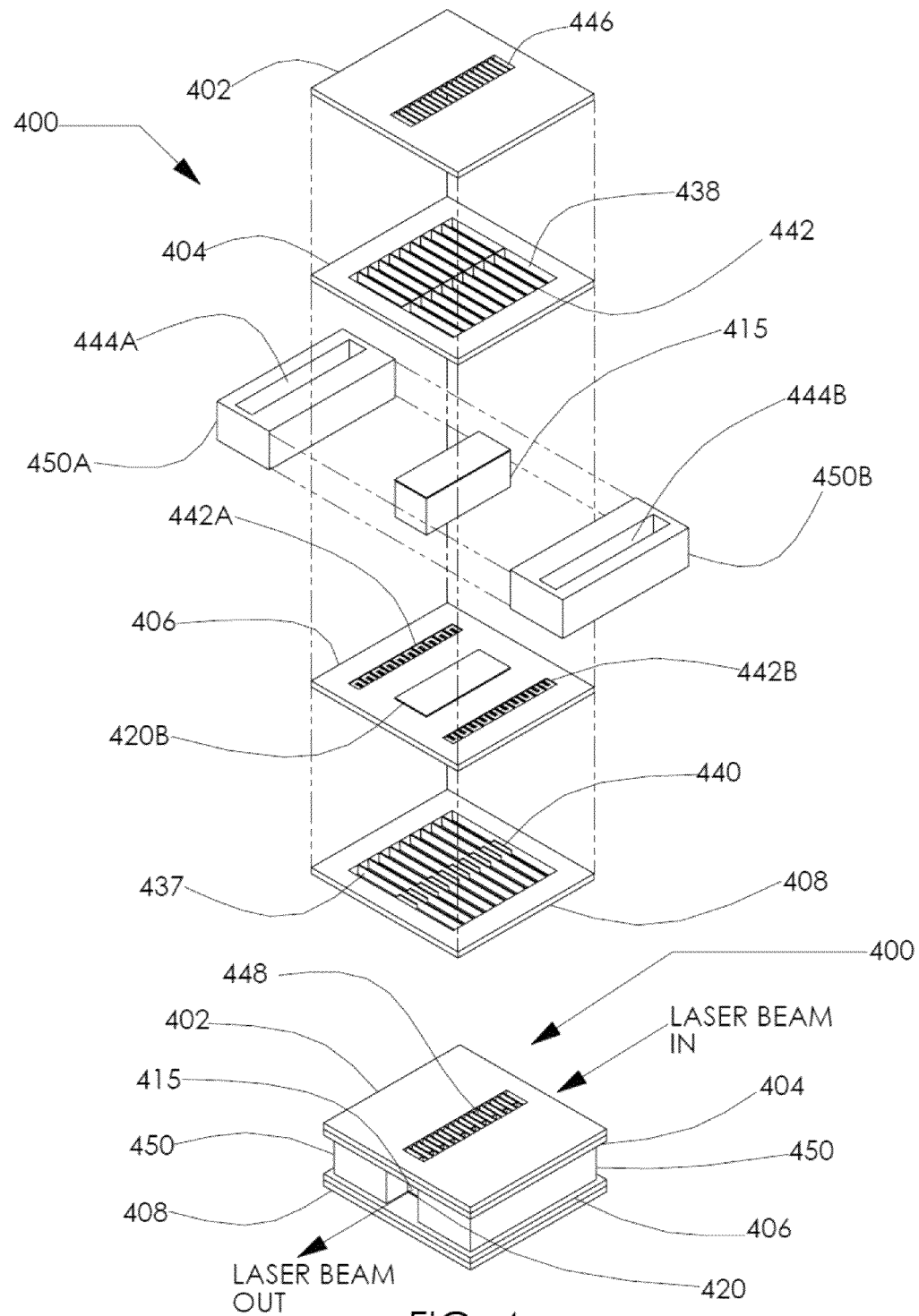
FIG. 4 illustrates a second silicon-based thermal energy transfer device for a rectangular cuboid-shaped gain medium of a laser system in accordance with one non-limiting embodiment.
Figure 5:
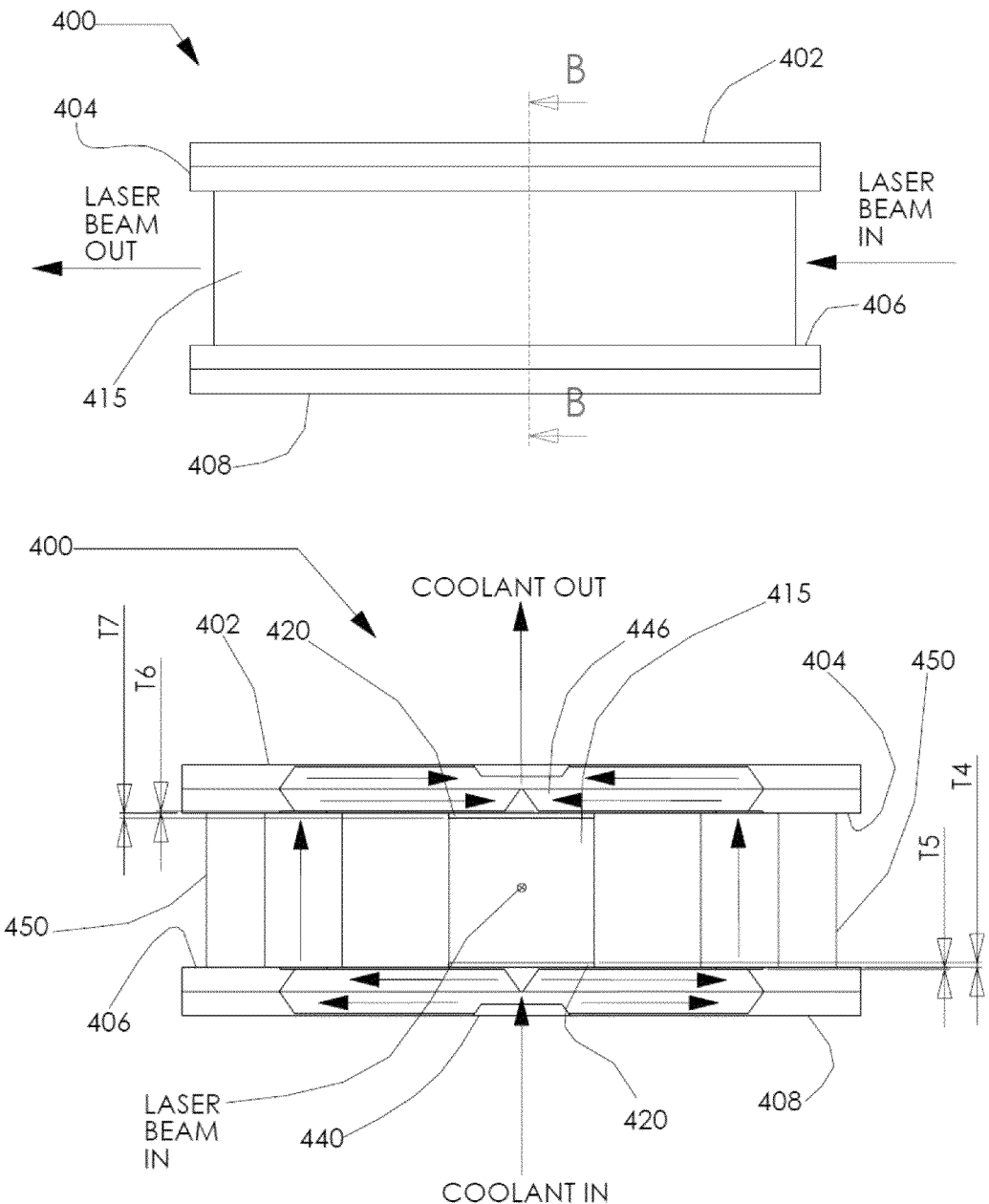
FIG. 5 illustrates a side view and a cross-sectional view of the silicon-based thermal energy transfer device of FIG. 4.
Figure 6:
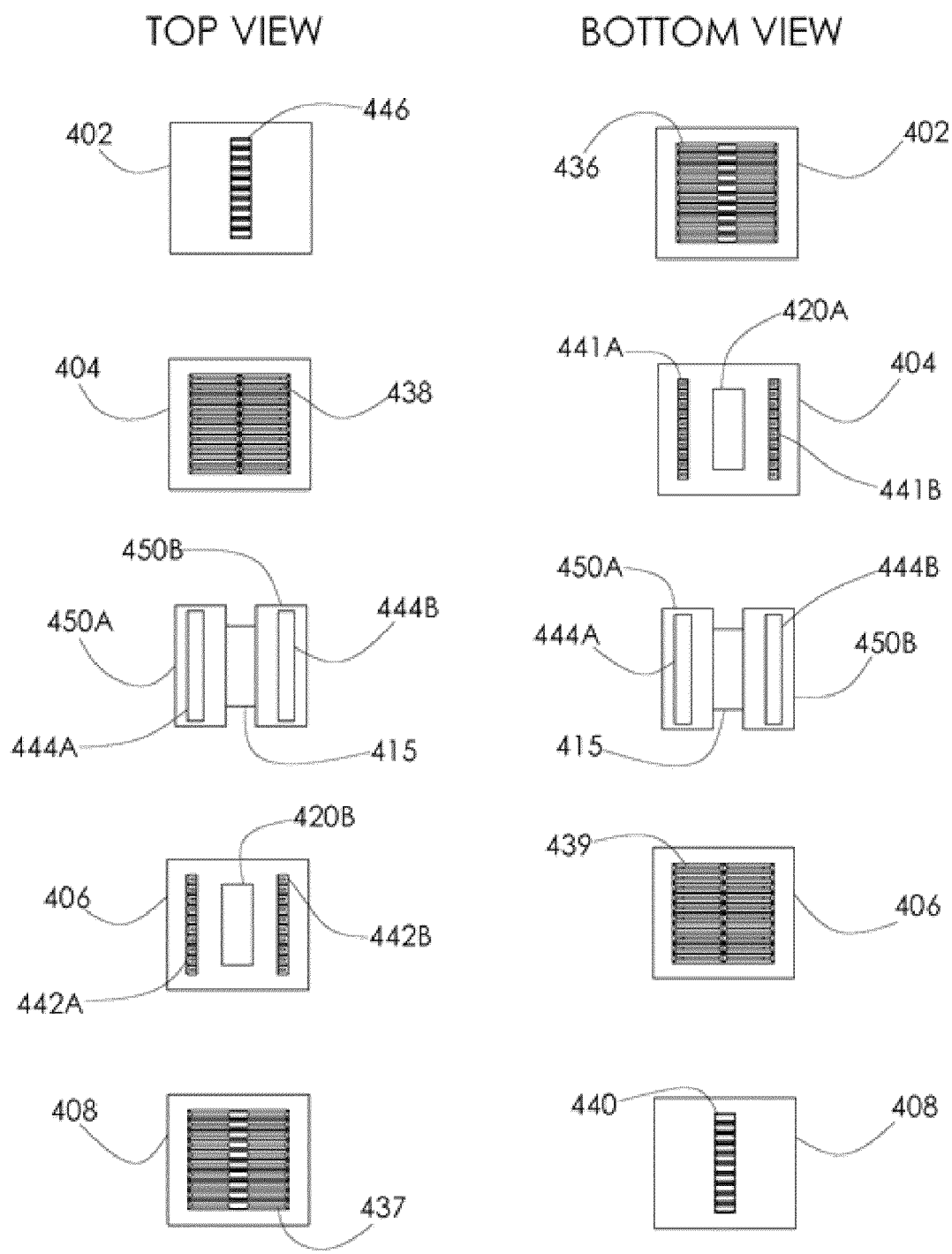
FIG. 6 illustrates a top view and a bottom view of the silicon-based thermal energy transfer device of FIG. 4.

FIGS. 4-6 illustrate various views of a silicon-based thermal energy transfer device 400 for a rectangular cuboid-shaped gain medium 415 of a laser system in accordance with one non-limiting embodiment. Gain medium 415 may be a crystal. The device 400 includes a first half structure 402, a second half structure 404, a third half structure 406, a fourth half structure 408, a first conduit element 450a, and a second conduit element 450b. Each of the first half structure 402, second half structure 404, third half structure 406, and fourth half structure 408 is made of silicon, e.g., single-crystal silicon. In one embodiment, each of the first half structure 402, second half structure 404, third half structure 406, and fourth half structure 408 is metal-plated with a metal such as, for example, gold.

In one embodiment, each of the first half structure 402, second half structure 404, third half structure 406, and fourth half structure 408 is fabricated from a respective silicon wafer using semiconductor fabrication technology including photolithography, dry etch, wet etch, etc. In one embodiment, the first half structure 402 and the fourth half structure 408 are identical, and therefore can be made by the same fabrication process and even be from the same silicon wafer. Likewise, in one embodiment, the second half structure 404 and the third half structure 406 are identical, and therefore can be made by the same fabrication process and even be from the same silicon wafer.

The first half structure 402 has a row of openings 446 as coolant outlet ports. As shown in FIG. 6, on one of the two primary surfaces of the first half structure 402, there are grooves 436 each of which associated with a respective one of the openings 446. The second half structure 404 has a first row of openings 441a and a second row of openings 441b as coolant inlet ports. As shown in FIG. 6, on one of the two primary surfaces of the second half structure 404, there are grooves 438 each of which connecting a respective pair of one of the openings 441a and one of the openings 441b. The primary surface of the second half structure 404 opposite the primary surface that has the grooves 438 is substantially flat to provide surface area to contact with the corresponding primary surface of the gain medium 415.

In one embodiment, the thinnest part of the second half structure 404 where the grooves 438 are, denoted as thickness T6 in FIG. 5, is approximately in a range of 50 to 100 µm.

The fourth half structure 408 has a row of openings 440 as coolant inlet ports. As shown in FIG. 6, on one of the two primary surfaces of the fourth half structure 408, there are grooves 437 each of which associated with a respective one of the openings 440. The third half structure 406 has a first row of openings 442a and a second row of openings 442b as coolant outlet ports. As shown in FIG. 6, on one of the two primary surfaces of the third half structure 406, there are grooves 439 each of which connecting a respective pair of one of the openings 442a and one of the openings 442b. The primary surface of the third half structure 406 opposite the primary surface that has the grooves 439 is substantially flat to provide surface area to contact with the corresponding primary surface of the gain medium 415.

In one embodiment, the thinnest part of the third half structure 406 where the grooves 439 are, denoted as thickness T5 in FIG. 5, is approximately in a range of 50 to 100 µm.

As shown in FIGS. 4 and 5, the first half structure 402 and the second half structure 404 together form a first manifold. The third half structure 406 and the fourth half structure 408 together form a second manifold. The first half structure 402 and the second half structure 404 may be affixed to each other by solder, silicon-to-gold eutectic bonding, or silicon-to-silicon bonding. The third half structure 406 and the fourth half structure 408 may be affixed to each other by solder, silicon-to-gold eutectic bonding, or silicon-to-silicon bonding.

The first conduit element 450a has a cavity 444a. The second conduit element 450b has a cavity 444b. When the first and second conduit elements 450a and 450b are coupled between the first manifold formed by the first and second half structures 402 and 404 and the second manifold formed by the third and fourth half structures 406 and 408, the cavities 444a and 444b allow a coolant to flow through the first and second conduit elements 450a and 450b from the openings 442a and 442b, which are the coolant outlet ports of the second manifold formed by the third half structure 406 and the fourth half structure 408, to the openings 441a and 441b, which are the coolant inlet ports of the first manifold formed by the first half structure 402 and the second half structure 404. In one embodiment, one or both of the first and second conduit elements 450a and 450b are made of a metal-based material such as, for example, copper, aluminum, or stainless steel. In one embodiment, one or both of the first and second conduit elements 450a and 450b are made of a ceramic or silicon material.

In various embodiments, a layer of thermally-conductive material 420a is coated on at least the side of the first manifold formed by the first and second half structures 402 and 404 that faces the second manifold formed by the third and fourth half structures 406 and 408. In one embodiment, the layer of thermally-conductive material 420a has a thickness, denoted as thickness T7 in FIG. 5, of approximately in a range of 100 to 200 µm. When the gain medium 415 is mounted between the first manifold formed by the first and second half structures 402 and 404 and the second manifold formed by the third and fourth half structures 406 and 408, one of the primary surfaces of the gain medium 415 is in direct contact with the layer of thermally-conductive material 420a.

Similarly, in various embodiments, a layer of thermally-conductive material 420b is coated on at least the side of the second manifold formed by the third and fourth half structures 406 and 408 that faces the first manifold formed by the first and second half structures 402 and 404. In one embodiment, the layer of thermally-conductive material 420b has a thickness, denoted as thickness T4 in FIG. 5, of approximately 100 to 200 µm. When the gain medium 415 is mounted between the first manifold formed by the first and second half structures 402 and 404 and the second manifold formed by the third and fourth half structures 406 and 408, one of the primary surfaces of the gain medium 415 is in direct contact with the layer of thermally-conductive material 420b.

The layers of thermally-conductive material 420a and 420b need to have good conductive thermal efficiency to maximize thermal energy in the gain medium 415 to be transferred to the second half structure 404 and the third half structure 406. The layers of thermally-conductive material 420a and 420b also relieve the thermal stress between the gain medium 415 and the second half structure 404 and the third half structure 406 when there is a temperature differential between the gain medium 415 and the second half structure 404 and the third half structure 406. In one embodiment, at least one of the layers of thermally-conductive material 420a and 420b is a layer of synthetic diamond. The layer of synthetic diamond may be of black color (with thermal conductivity of 800 to 1200 W-deg/m) or, alternatively, translucent color (with thermal conductivity of 1200 to 2000 W-deg/m). In another embodiment, at least one of the layers of thermally-conductive material 420a and 420b includes a plurality of nanotubes. The nanotubes need not be in any particular orientation or arrangement as the nanotubes serve as a gap or space filler in addition to aiding heat transfer.

As shown in FIGS. 4 and 5, when the rectangular cuboid-shaped gain medium 415 is mounted between the first manifold formed by the first and second half structures 402 and 404, the second manifold formed by the third and fourth half structures 406 and 408, and the first and second conduit elements 450a and 450b, four of the six primary surfaces of the gain medium 415 are in direct, or physical, contact with the device 400, leaving two of the six primary surfaces of the gain medium 415 exposed to allow a laser beam to shine through.

When device 400 is assembled with a coolant flowing through, as shown in FIG. 5, the coolant flows around the gain medium 415 by entering the coolant inlet ports of the first manifold to a first side of the gain medium 415 (e.g., bottom side of the gain medium 415 in FIG. 5), through the cavities 444a and 444b and around second and third sides of the gain medium 415 (e.g., left and right sides of the gain medium in FIG. 415), and exiting through the coolant outlet ports of the second manifold to a fourth side of the gain medium 415 (e.g., top side of the gain medium in FIG. 5). That is, the gain medium 415 is surrounded by the internal coolant flow channels when viewed along the longitudinal axis of the gain medium 415. Thus, thermal energy, or heat, in the gain medium 415 may be transferred to the coolant in the internal coolant flow channels surrounding the gain medium 415 in the first manifold, the second manifold, and the first and second conduit elements 450a and 450b, all of which are in direct, or physical, contact with the gain medium 415.

Figure 11:
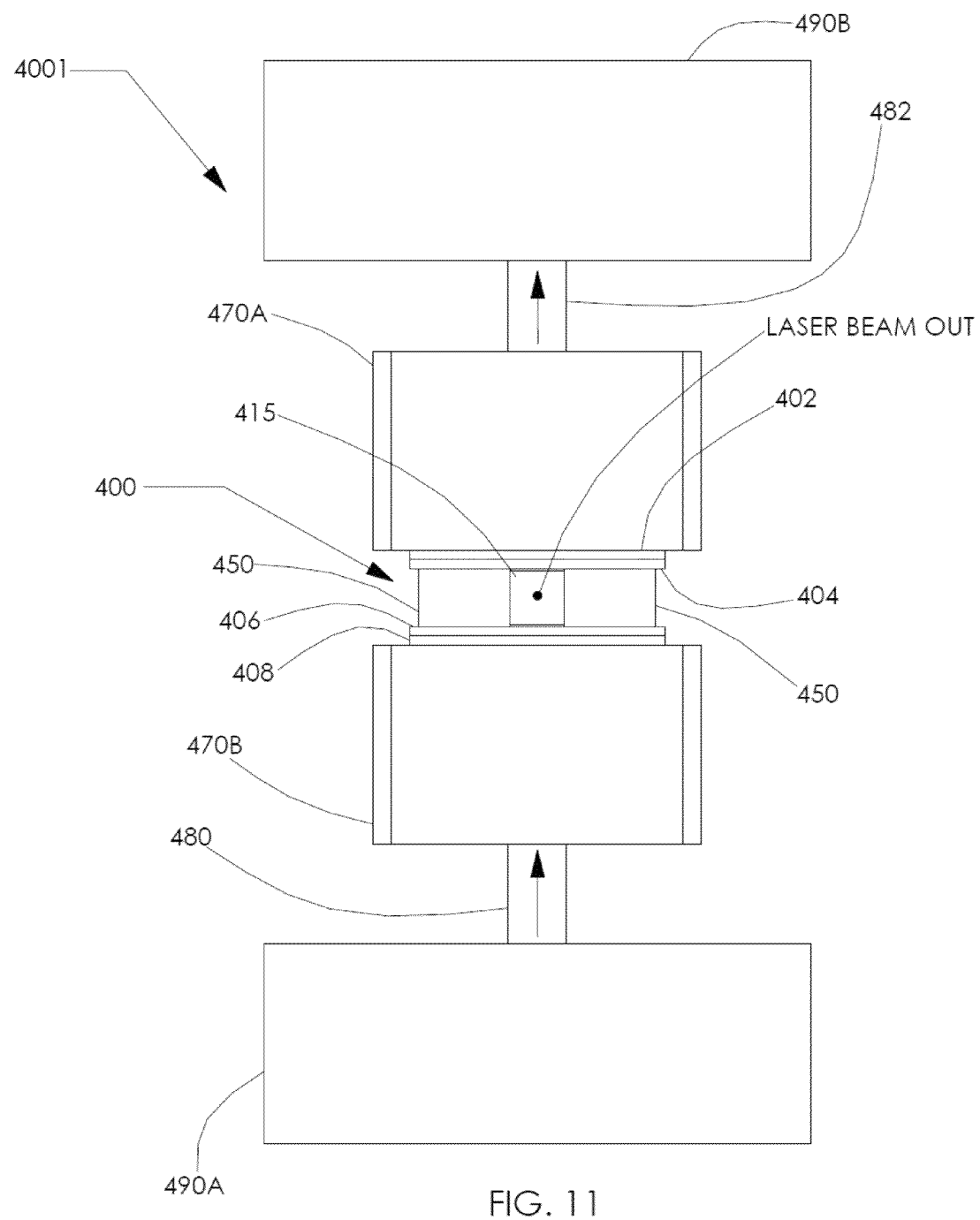
FIG. 11 illustrates a second thermal energy transfer apparatus that includes the silicon-based thermal energy transfer device of FIGS. 4-6 in accordance with one non-limiting embodiment.

FIG. 11 illustrates a thermal energy transfer apparatus 4001 that includes the silicon-based thermal energy transfer device 400 in accordance with one non-limiting embodiment. The apparatus 4001 includes an inbound coolant tubing 480, an outbound coolant tubing 482, a first adapter 470a, and a second adapter 470b.

The first adapter 470a has a first side coupled to the first side of the first manifold, formed by the first and second half structures 402 and 404, and a second side coupled to the outbound coolant tubing 482. The first adapter 470a has an internal coolant flow channel to allow the coolant to flow from the first manifold to the outbound coolant tubing 482 through the first adapter 470a. The second adapter 470b has a first side coupled to the first side of the second manifold, formed by the third and fourth half structures 406 and 408, and a second side coupled to the inbound coolant tubing 480. The second adapter 470b has an internal coolant flow channel to allow the coolant to flow from the inbound coolant tubing 480 to the second manifold through the second adapter 470b.

Each of the inbound coolant tubing 480, outbound coolant tubing 482, first adapter 470a, and second adapter 470b is respectively made of a non-corrosive material. In one embodiment, each of the inbound coolant tubing 480 and outbound coolant tubing 482 is respectively made of stainless steel, a nickel-plated metallic material, a gold-plated metallic material, or a ceramic material. In one embodiment, at least one of the first adapter 470a and second adapter 470b is made of a stainless steel or ceramic material. The materials that the inbound coolant tubing 480, outbound coolant tubing 482, first adapter 470a, and second adapter 470b are made of cannot be plastics or any material subject to corrosion when exposed to water. Chemicals leaching out of plastics or particles coming off of a material due to corrosion, when any of the inbound coolant tubing 480, outbound coolant tubing 482, first adapter 470a, or second adapter 470b is made of plastics or a corrosive material, will likely foul or clog up the internal coolant flow channels of the first manifold formed by the first and second half structure 402 and 404 as well as the internal coolant flow channels of the second manifold formed by the third and fourth half structures 406 and 408.

In one embodiment, the inbound coolant tubing 480 and the outbound coolant tubing 482 are respectively coupled to the second adapter 470b and the first adapter 470a by solder, press-fit, epoxy bonding, or single-body machined. In one embodiment, the first and second adapters 470a and 470b are coupled to the device 400 by solder or epoxy bonding.

In one embodiment, the apparatus 4001 includes a coolant supplier 490a coupled to the inbound coolant tubing 480 to supply the coolant at a first temperature range, and a coolant receiver 490b coupled to the outbound coolant tubing 482 to receive the coolant at a second temperature range that is higher than the temperature range. In an alternative embodiment, the coolant supplier 490a and the coolant receiver 490b are part of a single heat exchanger system.

Illustrative Third Thermal Energy Transfer Apparatus

Figure 7:
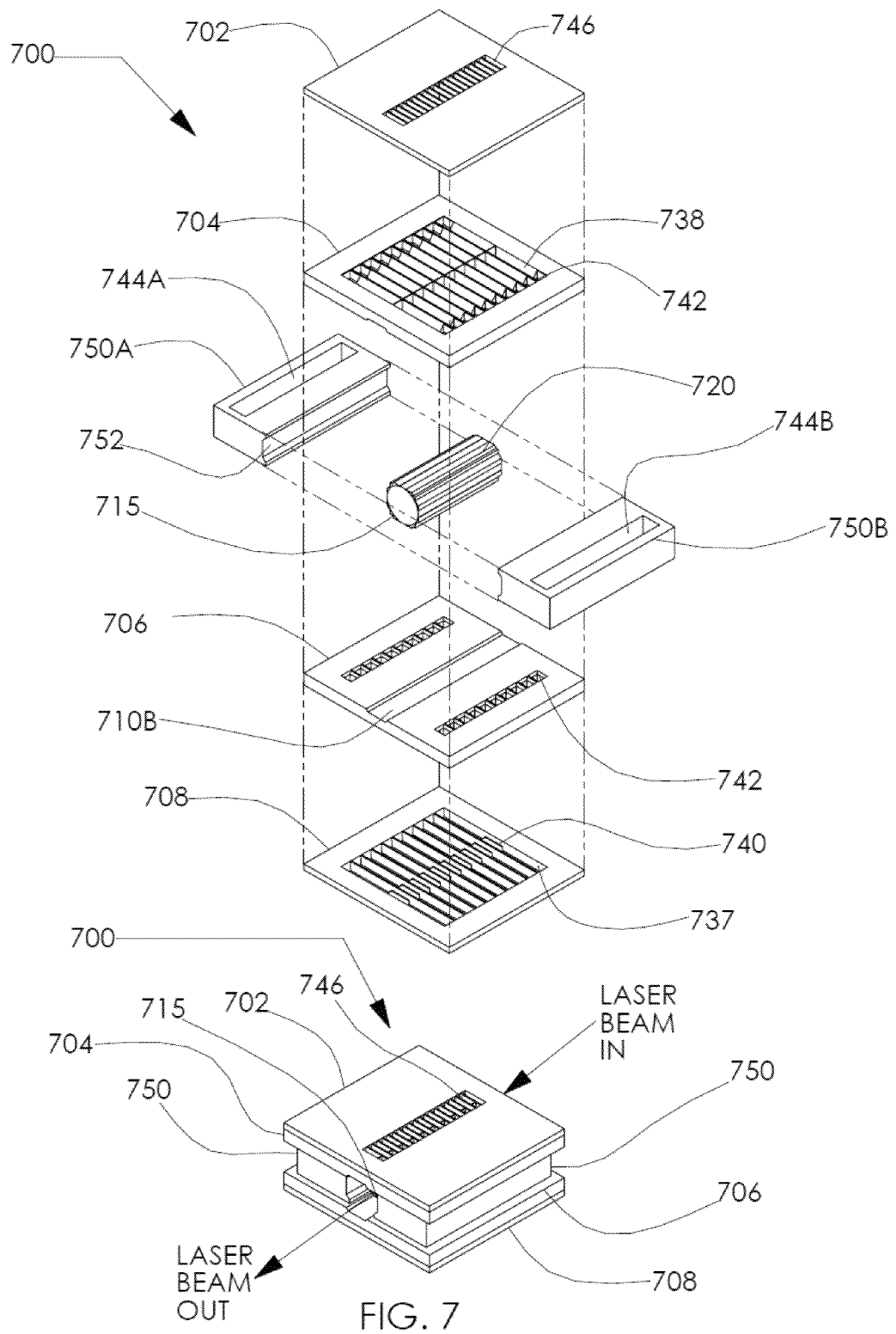
FIG. 7 illustrates a third silicon-based thermal energy transfer device for a right circular cylinder-shaped gain medium of a laser system in accordance with one non-limiting embodiment.
Figure 8:
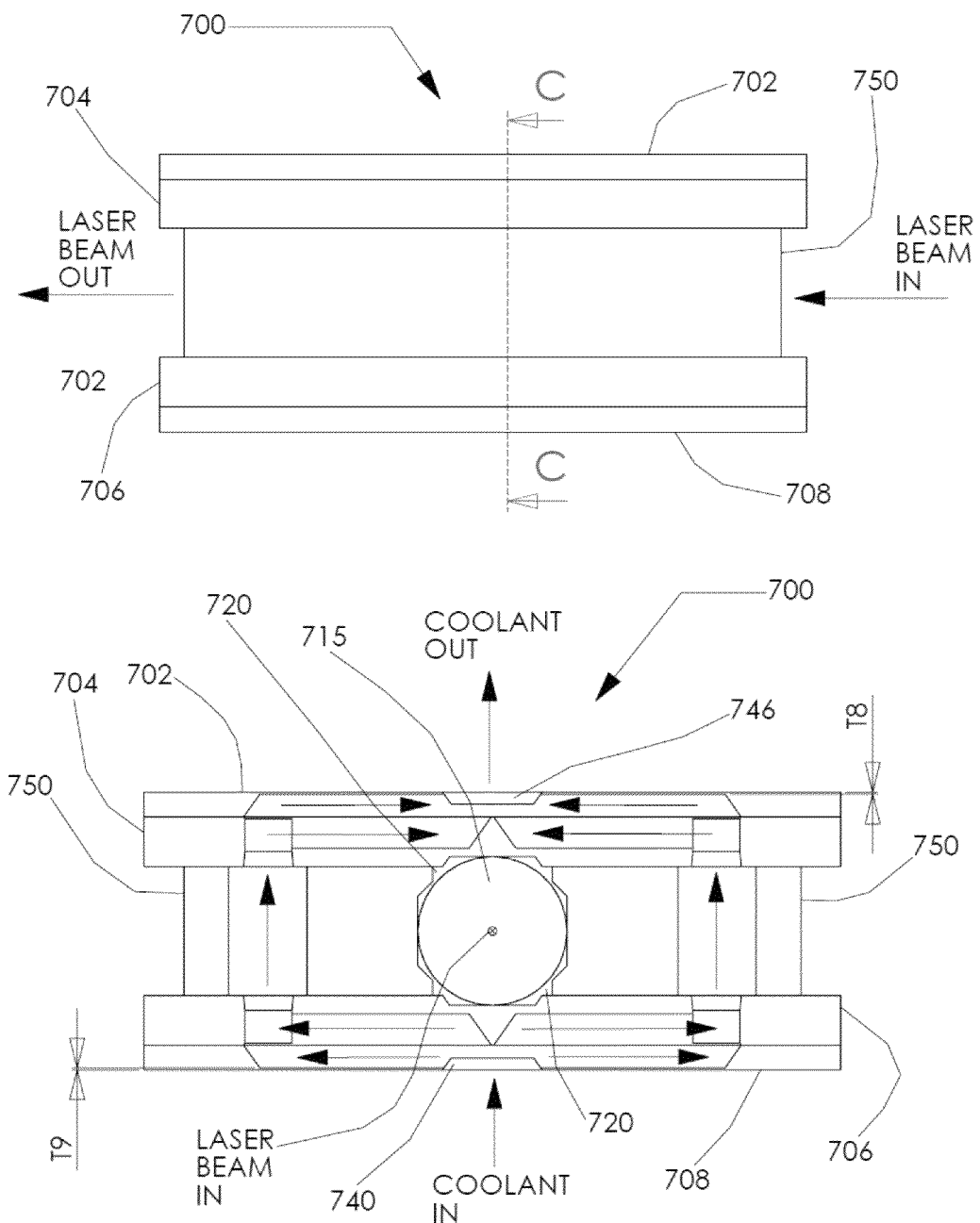
FIG. 8 illustrates a side view and a cross-sectional view of the silicon-based thermal energy transfer device of FIG. 7.
Figure 9:
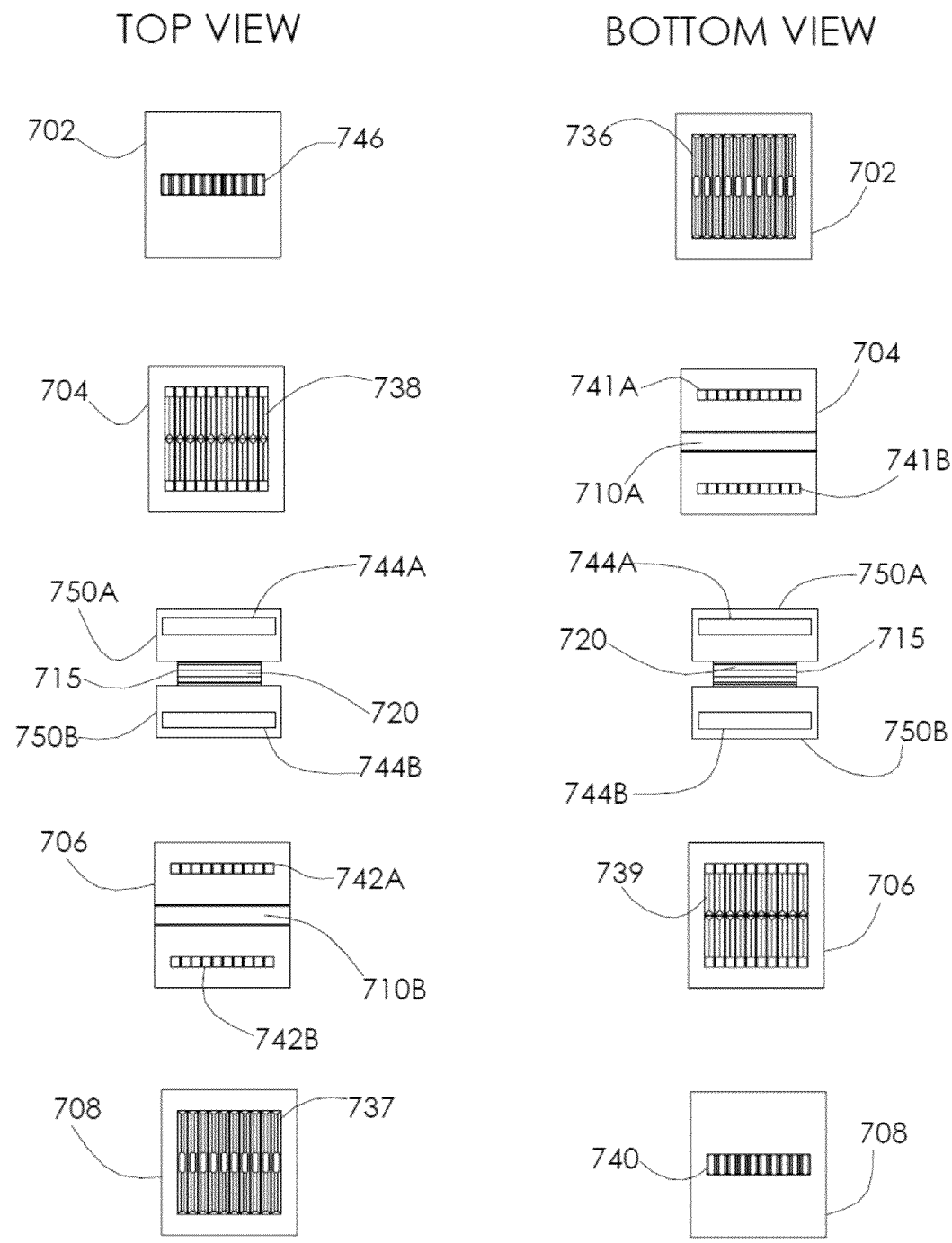
FIG. 9 illustrates a top view and a bottom view of the silicon-based thermal energy transfer device of FIG. 7.

FIGS. 7-9 illustrate various views of a silicon-based thermal energy transfer device 700 for a right circular cylinder-shaped gain medium 715 of a laser system in accordance with one non-limiting embodiment. Gain medium 715 may be a crystal or optical fiber. The device 700 includes a first half structure 702, a second half structure 704, a third half structure 706, a fourth half structure 708, a first conduit element 750a, and a second conduit element 750b. Each of the first half structure 702, second half structure 704, third half structure 706, and fourth half structure 708 is made of silicon, e.g., single-crystal silicon. In one embodiment, each of the first half structure 702, second half structure 704, third half structure 706, and fourth half structure 708 is metal-plated with a metal such as, for example, gold.

In one embodiment, each of the first half structure 702, second half structure 704, third half structure 706, and fourth half structure 708 is fabricated from a respective silicon wafer using semiconductor fabrication technology including photolithography, dry etch, wet etch, etc. In one embodiment, the first half structure 702 and the fourth half structure 708 are identical, and therefore can be made by the same fabrication process and even be from the same silicon wafer. Likewise, in one embodiment, the second half structure 704 and the third half structure 706 are identical, and therefore can be made by the same fabrication process and even be from the same silicon wafer.

The first half structure 702 has a row of openings 746 as coolant outlet ports. As shown in FIG. 9, on one of the two primary surfaces of the first half structure 702, there are grooves 736 each of which associated with a respective one of the openings 746. The second half structure 704 has a first row of openings 741a and a second row of openings 741b as coolant inlet ports. As shown in FIG. 9, on one of the two primary surfaces of the second half structure 704, there are grooves 738 each of which connecting a respective pair of one of the openings 741a and one of the openings 741b. The primary surface of the second half structure 704 opposite the primary surface that has the grooves 738 has a groove between the rows of openings 741a and 741b to accommodate the gain medium 715.

In one embodiment, the thinnest part of the first half structure 702 where the grooves 736 are, denoted as thickness T8 in FIG. 8, is approximately in a range of 100 to 200 μm.

The fourth half structure 708 has a row of openings 740 as coolant inlet ports. As shown in FIG. 9, on one of the two primary surfaces of the fourth half structure 708, there are grooves 737 each of which associated with a respective one of the openings 740. The third half structure 706 has a first row of openings 742a and a second row of openings 742b as coolant outlet ports. As shown in FIG. 9, on one of the two primary surfaces of the third half structure 706, there are grooves 739 each of which connecting a respective pair of one of the openings 742a and one of the openings 742b. The primary surface of the third half structure 706 opposite the primary surface that has the grooves 739 has a groove between the rows of openings 741a and 741b to accommodate the gain medium 715.

In one embodiment, the thinnest part of the fourth half structure 708 where the grooves 737 are, denoted as thickness T9 in FIG. 8, is approximately in a range of 100 to 200 µm.

As shown in FIGS. 7 and 8, the first half structure 702 and the second half structure 704 together form a first manifold. The third half structure 706 and the fourth half structure 708 together form a second manifold. The first half structure 702 and the second half structure 704 may be affixed to each other by solder, silicon-to-gold eutectic bonding, or silicon-to-silicon bonding. The third half structure 706 and the fourth half structure 708 may be affixed to each other by solder, silicon-to-gold eutectic bonding, or silicon-to-silicon bonding.

The first conduit element 750a has a cavity 744a. The second conduit element 750b has a cavity 744b. When the first and second conduit elements 750a and 750b are coupled between the first manifold formed by the first and second half structures 702 and 704 and the second manifold formed by the third and fourth half structures 706 and 708, the cavities 744a and 744b allow a coolant to flow through the first and second conduit elements 750a and 750b from the openings 742a and 742b, which are the coolant outlet ports of the second manifold formed by the third half structure 706 and the fourth half structure 708, to the openings 741a and 741b, which are the coolant inlet ports of the first manifold formed by the first half structure 702 and the second half structure 704. In one embodiment, one or both of the first and second conduit elements 750a and 750b are made of a metal-based material such as, for example, copper, aluminum, or stainless steel. In one embodiment, one or both of the first and second conduit elements 750a and 750b are made of a ceramic or silicon material.

As shown in FIGS. 7 and 8, when the right circular cylinder-shaped gain medium 715 is mounted between the first manifold formed by the first and second half structures 702 and 704, the second manifold formed by the third and fourth half structures 706 and 708, and the first and second conduit elements 750a and 750b, the periphery of the gain medium 715 is in direct, or physical, contact with multiple points of the device 700, leaving the two circular primary surfaces of the gain medium 715 exposed to allow a laser beam to shine through. In one embodiment, a filler material 720 fills the gap of space between the gain medium 715 and the first manifold formed by the first and second half structures 702 and 704, between the gain medium 715 and the second manifold formed by the third and fourth half structures 706 and 708, and between the gain medium 715 and the first and second conduit elements 750a and 750b. The filler material 720 has high thermal conductivity and promotes the transfer of thermal energy from the gain medium 715 to the device 700. In one embodiment, the filler material 720 is a soft solder, indium, silver glass, or thermal epoxy.

When device 700 is assembled with a coolant flowing through, as shown in FIG. 8, the coolant flows around the gain medium 715 by entering the coolant inlet ports of the first manifold to a first side of the gain medium 715 (e.g., bottom side of the gain medium 715 in FIG. 8), through the cavities 744a and 744b and around second and third sides of the gain medium 715 (e.g., left and right sides of the gain medium 715 in FIG. 8), and exiting through the coolant outlet ports of the second manifold to a fourth side of the gain medium 715 (e.g., top side of the gain medium 715 in FIG. 8). That is, the gain medium 715 is surrounded by the internal coolant flow channels when viewed along the longitudinal axis of the gain medium 715. Thus, thermal energy, or heat, in the gain medium 715 may be transferred to the coolant in the internal coolant flow channels surrounding the gain medium 715 in the first manifold, the second manifold, and the first and second conduit elements 750a and 750b, all of which are in direct, or physical, contact with the gain medium 715.

Figure 12:
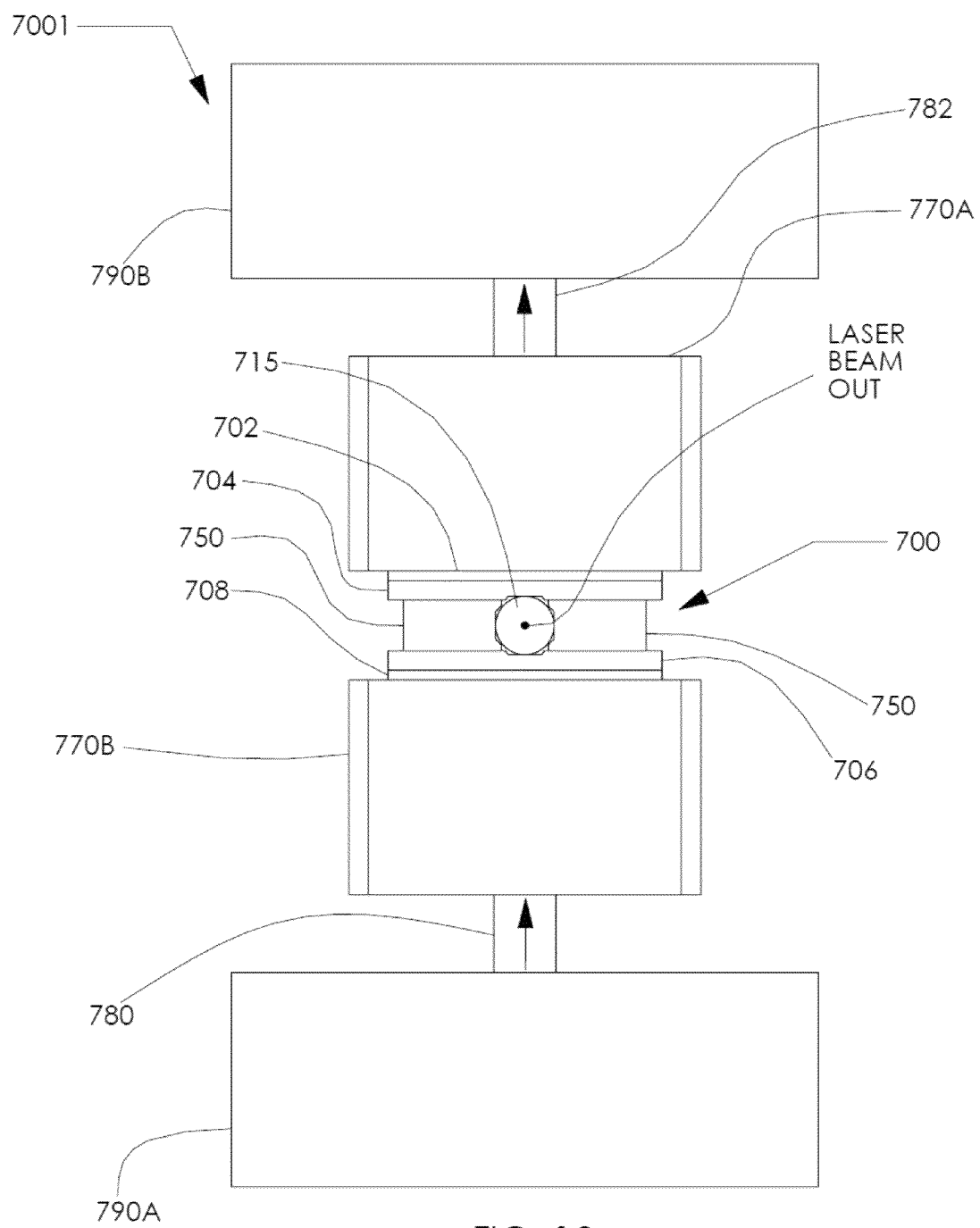
FIG. 12 illustrates a third thermal energy transfer apparatus that includes the silicon-based thermal energy transfer device of FIGS. 7-9 in accordance with one non-limiting embodiment.

FIG. 12 illustrates a thermal energy transfer apparatus 7001 that includes the silicon-based thermal energy transfer device 700 in accordance with one non-limiting embodiment. The apparatus 7001 includes an inbound coolant tubing 780, an outbound coolant tubing 782, a first adapter 770a, and a second adapter 770b.

The first adapter 770a has a first side coupled to the first side of the first manifold, formed by the first and second half structures 702 and 704, and a second side coupled to the outbound coolant tubing 782. The first adapter 770a has an internal coolant flow channel to allow the coolant to flow from the first manifold to the outbound coolant tubing 782 through the first adapter 770a. The second adapter 770b has a first side coupled to the first side of the second manifold, formed by the third and fourth half structures 706 and 708, and a second side coupled to the inbound coolant tubing 780. The second adapter 770b has an internal coolant flow channel to allow the coolant to flow from the inbound coolant tubing 780 to the second manifold through the second adapter 770b.

Each of the inbound coolant tubing 780, outbound coolant tubing 782, first adapter 770a, and second adapter 770b is respectively made of a non-corrosive material. In one embodiment, each of the inbound coolant tubing 780 and outbound coolant tubing 782 is respectively made of stainless steel, a nickel-plated metallic material, a gold-plated metallic material, or a ceramic material. In one embodiment, at least one of the first adapter 770a and second adapter 770b is made of a ceramic material. The materials that the inbound coolant tubing 780, outbound coolant tubing 782, first adapter 770a, and second adapter 770b are made of cannot be plastics or any material subject to corrosion when exposed to water. Chemicals leaching out of plastics or particles coming off of a material due to corrosion, when any of the inbound coolant tubing 780, outbound coolant tubing 782, first adapter 770a, or second adapter 770b is made of plastics or a corrosive material, will likely foul or clog up the internal coolant flow channels of the first manifold formed by the first and second half structure 702 and 704 as well as the internal coolant flow channels of the second manifold formed by the third and fourth half structures 706 and 708.

In one embodiment, the inbound coolant tubing 780 and the outbound coolant tubing 782 are respectively coupled to the second adapter 770b and the first adapter 770a by solder, press-fit, epoxy bonding, or single-body machining. In one embodiment, the first and second adapters 770a and 770b are coupled to the device 700 by solder, press-fit, epoxy bonding, or single-body machining.

In one embodiment, the apparatus 7001 includes a coolant supplier 790a coupled to the inbound coolant tubing 780 to supply the coolant at a first temperature range, and a coolant receiver 790b coupled to the outbound coolant tubing 782 to receive the coolant at a second temperature range that is higher than the temperature range. In an alternative embodiment, the coolant supplier 790a and the coolant receiver 790b are part of a single heat exchanger system.

Illustrative Fourth Thermal Energy Transfer Apparatus

Figure 13:
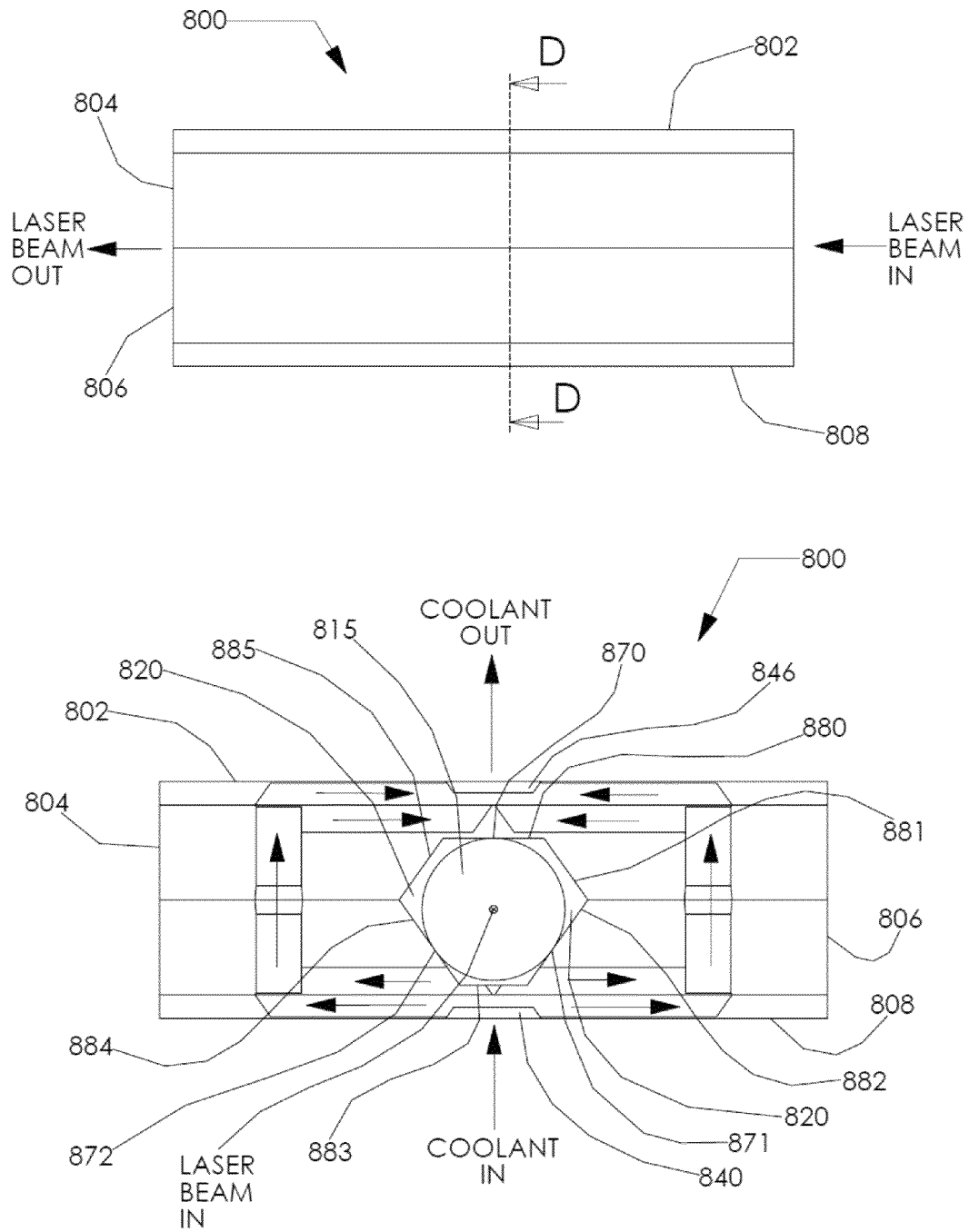
FIG. 13 illustrates a side view and a cross-sectional view of a silicon-based thermal energy transfer device in accordance with one non-limiting embodiment.

FIG. 13 illustrates various views of a silicon-based thermal energy transfer device 800 for a right circular cylinder-shaped gain medium 815 of a laser system in accordance with one non-limiting embodiment. Device 800 may be a substitute of device 700 in the thermal energy transfer apparatus 7001 shown in FIG. 12. Thus, the apparatus 7001 described above may be implemented with device 800.

Gain medium 815 may be a crystal or optical fiber. The optical fiber may be doped with rare earth elements and used in fiber laser. The device 800 includes a first half structure 802, a second half structure 804, a third half structure 806, and a fourth half structure 808. Each of the first half structure 802, second half structure 804, third half structure 806, and fourth half structure 808 is made of silicon, e.g., single-crystal silicon. In one embodiment, each of the first half structure 802, second half structure 804, third half structure 806, and fourth half structure 808 is metal-plated with a metal such as, for example, gold.

In one embodiment, each of the first half structure 802, second half structure 804, third half structure 806, and fourth half structure 808 is fabricated from a respective silicon wafer using semiconductor fabrication technology including photolithography, dry etch, wet etch, etc. In one embodiment, the first half structure 802 and the fourth half structure 808 are identical, and therefore can be made by the same fabrication process and even be from the same silicon wafer. Likewise, in one embodiment, the second half structure 804 and the third half structure 806 are identical, and therefore can be made by the same fabrication process and even be from the same silicon wafer.

The first half structure 802 has a row of openings 846 as coolant outlet ports. On one of the two primary surfaces of the first half structure 802, there are grooves each of which associated with a respective one of the openings 846. The second half structure 804 has a first row of openings and a second row of openings as coolant inlet ports. On a first primary surface of the second half structure 804, there are first grooves each of which connecting a respective pair of one of the first row of openings and one of the second row of openings. On a second primary surface of the second half structure 804 opposite the first primary surface there is a second groove between the first and second rows of openings to accommodate the gain medium 815. Specifically, the second groove has surfaces 880, 881 and 885. As shown in FIG. 13, the second half structure 804 has cavities that allow a coolant to flow through the second half structure 804 from two inlets on one primary side thereof to openings on the opposing primary side thereof.

In one embodiment, the thinnest part of the first half structure 802, where the grooves are, is approximately in a range of 100 to 200 μm.

The fourth half structure 808 has a row of openings 840 as coolant inlet ports. On one of the two primary surfaces of the fourth half structure 808, there are grooves each of which associated with a respective one of the openings 840. The third half structure 806 has a first row of openings and a second row of openings as coolant outlet ports. On a first primary surface of the third half structure 806, there are third grooves each of which connecting a respective pair of one of the first row of openings and one of the second row of openings. On a second primary surface of the third half structure 806 opposite the first primary surface there is a fourth groove between the first and second rows of openings to accommodate the gain medium 815. Specifically, the fourth groove has surfaces 882, 883 and 884. As shown in FIG. 13, the third half structure 806 has cavities that allow a coolant to flow through the third half structure 806 from openings on one primary side thereof to two outlets on the opposing primary side thereof.

In one embodiment, the thinnest part of the fourth half structure 808, where the grooves are, is approximately in a range of 100 to 200 μm.

As shown in FIG. 13, the first half structure 802 and the second half structure 804 together form a first manifold. The third half structure 806 and the fourth half structure 808 together form a second manifold. The first half structure 802 and the second half structure 804 may be affixed to each other by solder, silicon-to-gold eutectic bonding, or silicon-to-silicon bonding. The third half structure 806 and the fourth half structure 808 may be affixed to each other by solder, silicon-to-gold eutectic bonding, or silicon-to-silicon bonding.

As shown in FIG. 13, when the right circular cylinder-shaped gain medium 815 is mounted between the first manifold formed by the first and second half structures 802 and 804, and the second manifold formed by the third and fourth half structures 806 and 808, the periphery of the gain medium 815 is in direct, or physical, contact with at least three locations of the device 800, leaving the two circular primary surfaces of the gain medium 815 exposed to allow a laser beam to shine through. In one embodiment, a filler material 820 fills the gap of space between the gain medium 815 and the first manifold formed by the first and second half structures 802 and 804, and between the gain medium 815 and the second manifold formed by the third and fourth half structures 806 and 808. The filler material 820 has high thermal conductivity and promotes the transfer of thermal energy from the gain medium 815 to the device 800. In one embodiment, the filler material 820 is a soft solder, indium, silver glass, or thermal epoxy.

When device 800 is assembled, surfaces 880, 881 and 885 on the second groove of the second half structure 804 and surfaces 882, 883 and 884 on the fourth groove of the third half structure 806 form through hole having a generally hexagonal cross section when viewed along the longitudinal axis of the gain medium 815, as shown in FIG. 13. The gain medium 815 is received in the through hole. This allows at least three locations on the gain medium 815 to be in direct, or physical, contact with the first manifold and the second manifold of device 800. In the cross-sectional view shown in FIG. 13, the gain medium 815 contacts the first manifold and the second manifold at least at points 870, 871 and 872.

When a coolant flows through device 800, as shown in FIG. 13, the coolant flows around the gain medium 815 by entering the second manifold to a first side of the gain medium 815 (e.g., bottom side of the gain medium 815 in FIG. 13), through the cavities in the second manifold and the first manifold around second and third sides of the gain medium 815 (e.g., left and right sides of the gain medium 815 in FIG. 13), and exiting through the first manifold to a fourth side of the gain medium 815 (e.g., top side of the gain medium 815 in FIG. 13). That is, the gain medium 815 is surrounded by the internal coolant flow channels when viewed along the longitudinal axis of the gain medium 815. Put differently, the internal coolant flow channels surround the through hole. Thus, thermal energy, or heat, in the gain medium 815 may be transferred to the coolant in the internal coolant flow channels surrounding the gain medium 815 in the first manifold and the second manifold, which are in direct, or physical, contact with the gain medium 815.

Illustrative Fifth Thermal Energy Transfer Apparatus

Figure 14:
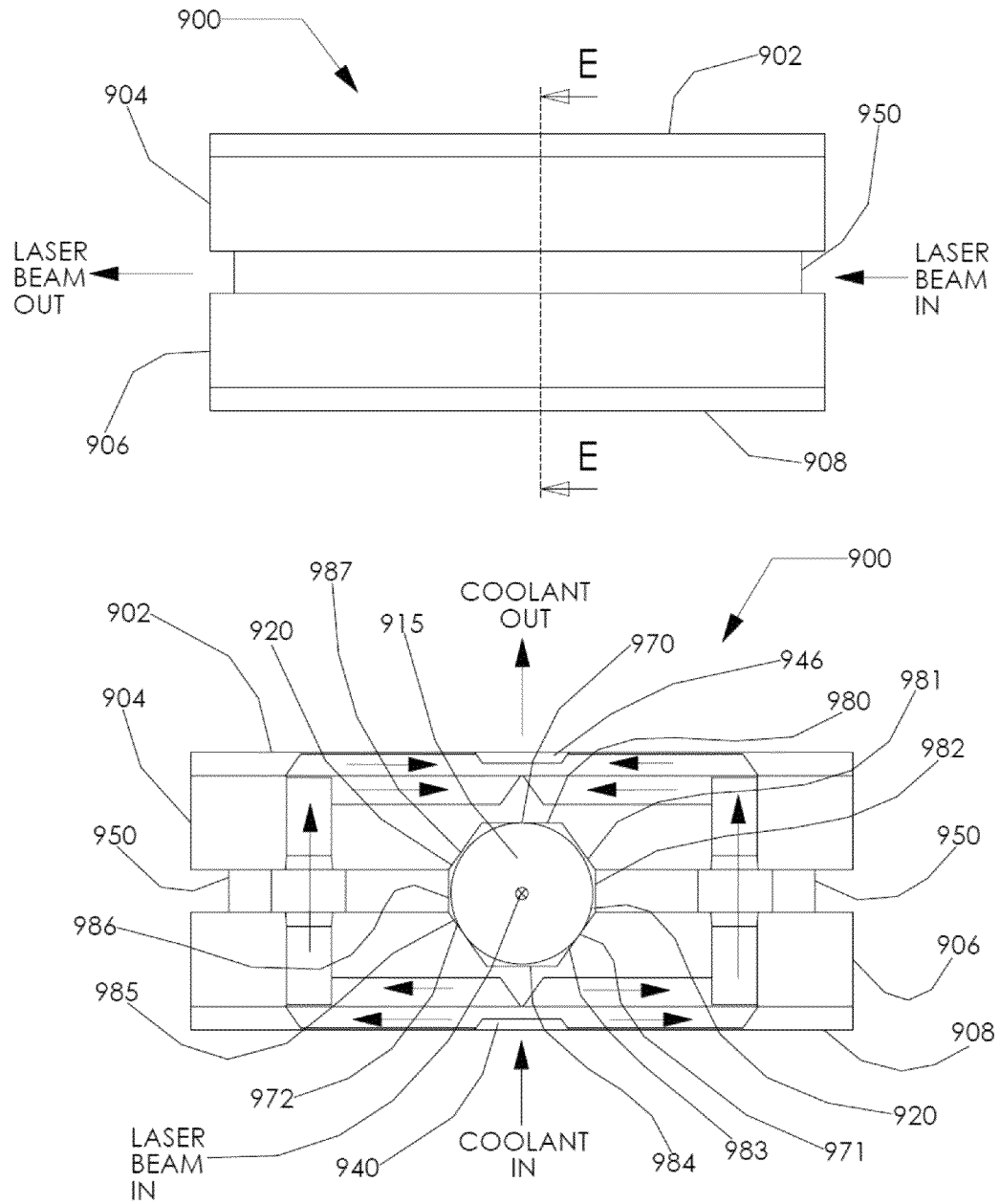
FIG. 14 illustrates a side view and a cross-sectional view of the silicon-based thermal energy transfer device in accordance with another non-limiting embodiment.

FIG. 14 illustrates various views of a silicon-based thermal energy transfer device 900 for a right circular cylinder-shaped gain medium 915 of a laser system in accordance with one non-limiting embodiment. Device 900 may be a substitute of device 700 in the thermal energy transfer apparatus 7001 shown in FIG. 12. Thus, the apparatus 7001 described above may be implemented with device 900.

Gain medium 915 may be a crystal or optical fiber. The optical fiber may be doped with rare earth elements and used in fiber laser. The device 900 includes a first half structure 902, a second half structure 904, a third half structure 906, a fourth half structure 908, a first conduit element, and a second conduit element (with the first and second conduit elements together shown as conduit element 950 in FIG. 14). Each of the first half structure 902, second half structure 904, third half structure 906, and fourth half structure 908 is made of silicon, e.g., single-crystal silicon. In one embodiment, each of the first half structure 902, second half structure 904, third half structure 906, and fourth half structure 908 is metal-plated with a metal such as, for example, gold.

In one embodiment, each of the first half structure 902, second half structure 904, third half structure 906, and fourth half structure 908 is fabricated from a respective silicon wafer using semiconductor fabrication technology including photolithography, dry etch, wet etch, etc. In one embodiment, the first half structure 902 and the fourth half structure 908 are identical, and therefore can be made by the same fabrication process and even be from the same silicon wafer. Likewise, in one embodiment, the second half structure 904 and the third half structure 906 are identical, and therefore can be made by the same fabrication process and even be from the same silicon wafer.

The first half structure 902 has a row of openings 946 as coolant outlet ports. On one of the two primary surfaces of the first half structure 902, there are grooves each of which associated with a respective one of the openings 946. The second half structure 904 has a first row of openings and a second row of openings as coolant inlet ports. On a first primary surface of the second half structure 904, there are first grooves each of which connecting a respective pair of one of the first row of openings and one of the second row of openings. On a second primary surface of the second half structure 904 opposite the first primary surface there is a second groove between the first and second rows of openings to accommodate the gain medium 915. Specifically, the second groove has surfaces 980, 981 and 987. As shown in FIG. 14, the second half structure 904 has cavities that allow a coolant to flow through the second half structure 904 from two inlets on one primary side thereof to openings on the opposing primary side thereof.

In one embodiment, the thinnest part of the first half structure 902, where the grooves are, is approximately in a range of 100 to 200 μm.

The fourth half structure 908 has a row of openings 940 as coolant inlet ports. On one of the two primary surfaces of the fourth half structure 908, there are grooves each of which associated with a respective one of the openings 940. The third half structure 906 has a first row of openings and a second row of openings as coolant outlet ports. On a first primary surface of the third half structure 906, there are third grooves each of which connecting a respective pair of one of the first row of openings and one of the second row of openings. On a second primary surface of the third half structure 906 opposite the first primary surface there is a fourth groove between the first and second rows of openings to accommodate the gain medium 915. Specifically, the fourth groove has surfaces 983, 984 and 985. As shown in FIG. 14, the third half structure 906 has cavities that allow a coolant to flow through the third half structure 906 from openings on one primary side thereof to two outlets on the opposing primary side thereof.

In one embodiment, the thinnest part of the fourth half structure 908, where the grooves are, is approximately in a range of 100 to 200 μm.

As shown in FIG. 14, the first half structure 902 and the second half structure 904 together form a first manifold. The third half structure 906 and the fourth half structure 908 together form a second manifold. The first half structure 902 and the second half structure 904 may be affixed to each other by solder, silicon-to-gold eutectic bonding, or silicon-to-silicon bonding. The third half structure 906 and the fourth half structure 908 may be affixed to each other by solder, silicon-to-gold eutectic bonding, or silicon-to-silicon bonding.

The first conduit element has a first cavity. The second conduit element has a second cavity. When the first and second conduit elements are coupled between the first manifold formed by the first and second half structures 902 and 904 and the second manifold formed by the third and fourth half structures 906 and 908, the first and second cavities allow a coolant to flow through the first and second conduit elements, from the coolant outlet ports of the second manifold formed by the third half structure 906 and the fourth half structure 908 to the coolant inlet ports of the first manifold formed by the first half structure 902 and the second half structure 904. In one embodiment, one or both of the first and second conduit elements are made of a metal-based material such as, for example, copper, aluminum, or stainless steel. In one embodiment, one or both of the first and second conduit elements are made of a ceramic or silicon material.

As shown in FIG. 14, when the right circular cylinder-shaped gain medium 915 is mounted between the first manifold formed by the first and second half structures 902 and 904, the second manifold formed by the third and fourth half structures 906 and 908, and the first and second conduit elements, the periphery of the gain medium 915 is in direct, or physical, contact with at least three locations of the device 900, leaving the two circular primary surfaces of the gain medium 915 exposed to allow a laser beam to shine through. In one embodiment, a filler material 920 fills the gap of space between the gain medium 915 and the first manifold formed by the first and second half structures 902 and 904, between the gain medium 915 and the second manifold formed by the third and fourth half structures 906 and 908, and between the gain medium 915 and the first and second conduit elements. The filler material 920 has high thermal conductivity and promotes the transfer of thermal energy from the gain medium 915 to the device 900. In one embodiment, the filler material 920 is a soft solder, indium, silver glass, or thermal epoxy.

When device 900 is assembled, surfaces 980, 981 and 987 on the second groove of the second half structure 904, surfaces 983, 984 and 985 on the fourth groove of the third half structure 906, and surfaces 982 and 986 on the first and second conduit elements (shown as conduit element 950) form a through hole having a generally octagonal cross section when viewed along the longitudinal axis of the gain medium 915, as shown in FIG. 14. The gain medium 915 is received in the through hole. This allows at least three locations on the gain medium 915 to be in direct, or physical, contact with the first manifold and the second manifold of device 900. In the cross-sectional view shown in FIG. 14, the gain medium 915 contacts the first manifold, the second manifold and the conduit element 950 at least at points 970, 971 and 972.

When a coolant flows through device 900, as shown in FIG. 14, the coolant flows around the gain medium 915 by entering the second manifold to a first side of the gain medium 915 (e.g., bottom side of the gain medium 915 in FIG. 14), through the cavities in the second manifold, the conduit element 750 and the first manifold around second and third sides of the gain medium 915 (e.g., left and right sides of the gain medium 915 in FIG. 14), and exiting through the first manifold to a fourth side of the gain medium 915 (e.g., top side of the gain medium 915 in FIG. 14). That is, the gain medium 915 is surrounded by the internal coolant flow channels when viewed along the longitudinal axis of the gain medium 915. Put differently, the internal coolant flow channels surround the through hole. Thus, thermal energy, or heat, in the gain medium 915 may be transferred to the coolant in the internal coolant flow channels surrounding the first manifold, the second manifold and the conduit element 750, some or all of which are in direct, or physical, contact with the gain medium 915.

CONCLUSION

The above-described techniques pertain to silicon-based thermal energy transfer for the gain medium of a laser system. However, techniques disclosed herein are not limited to silicon-based thermal energy transfer devices and apparatuses. Rather, a different material, e.g., aluminum nitride, may be used in place of silicon in the various embodiments described herein.

Although the techniques have been described in language specific to structural features and/or methodological acts, it is to be understood that the appended claims are not necessarily limited to the specific features or acts described. Rather, the specific features and acts are disclosed as exemplary forms of implementing such techniques. Furthermore, although the techniques have been described in the context of laser systems using laser diodes, the techniques may be applied in any other suitable context.

What is claimed is:

1. A thermal energy transfer apparatus that removes thermal energy from a gain medium of a laser system, the apparatus comprising:
   a silicon-based first manifold having first internal coolant flow channels therein, the first manifold having a first primary side and a second primary side opposite the first primary side with the first internal coolant flow channels fluidly connect the first primary side and the second primary side of the first manifold, the second primary side of the first manifold having a first groove; and
   a silicon-based second manifold having second internal coolant flow channels therein, the second manifold having a first primary side and a second primary side opposite the first primary side with the second internal coolant flow channels fluidly connecting the first primary side and the second primary side of the second manifold, the second primary side of the second manifold having a second groove, wherein:
      when the first manifold and the second manifold are coupled together with the second primary side of the first manifold facing the second primary side of the second manifold, a first through hole configured to receive the gain medium is formed between the first manifold and the second manifold, and
      the first through hole has a polygonal cross section when viewed along a longitudinal axis of the gain medium.

2. The apparatus of claim 1, wherein the first internal coolant flow channels in the first manifold and the second internal coolant flow channels in the second manifold are configures such that, when the gain medium is received in the first through hole between the first manifold and the second manifold, the gain medium is surrounded by the first internal coolant flow channels and the second internal coolant flow channels when viewed along the longitudinal axis of the gain medium.

3. The apparatus of claim 1, wherein at least three locations on the gain medium are in physical contact with the first manifold and the second manifold when the gain medium is received in the first through hole.

4. The apparatus of claim 1, wherein the first through hole has a generally hexagonal cross section when viewed along the longitudinal axis of the gain medium.

5. The apparatus of claim 1, further comprising:
   a first conduit element; and
   a second conduit element, wherein:
      the first and second conduit elements are coupled between the first manifold and the second manifold to provide flow paths for a coolant to flow from the second manifold to the first manifold,
      when the first conduit element and the second conduit element are coupled between the first manifold and the second manifold with the second primary side of the first manifold facing the second primary side of the second manifold, a second through hole configured to receive the gain medium is formed between the first manifold, the second manifold, the first conduit element and the second conduit element, and
      the second through hole has a polygonal cross section when viewed along the longitudinal axis of the gain medium.

6. The apparatus of claim 5, wherein at least one of the first conduit element or the second conduit element is made of a metal-based or ceramic material.

7. The apparatus of claim 5, wherein the second through hole has a generally octagonal cross section when viewed along the longitudinal axis of the gain medium.

8. The apparatus of claim 1, further comprising:
   a layer of synthetic diamond between and in contact with the first manifold and the gain medium; and
   a layer of synthetic diamond between and in contact with the second manifold and the gain medium.

9. The apparatus of claim 1, further comprising:
   a plurality of nanotubes between and in contact with the first manifold and the gain medium; and
   a plurality of nanotubes between and in contact with the second manifold and the gain medium.

10. The apparatus of claim 1, further comprising:
    an outbound coolant tubing made of a metallic or ceramic material;
    a first adapter made of a metallic or ceramic material, the first adapter having a first side and a second side, wherein:
       the first side of the first adapter is coupled to the first manifold,
       the second side of the first adapter is coupled to the outbound coolant tubing, and
       the first adapter includes an internal coolant flow channel that allows the coolant to flow from the first manifold to the outbound coolant tubing through the first adapter;
    an inbound coolant tubing made of a metallic or ceramic material; and
    a second adapter made of a metallic or ceramic material, the second adapter having a first side and a second side, wherein:
       the first side of the second adapter is coupled to the second manifold,
       the second side of the second adapter is coupled to the inbound coolant tubing, and
       the second adapter includes an internal coolant flow channel that allows the coolant to flow from the inbound coolant tubing to the second manifold through the second adapter.

11. The apparatus of claim 10, further comprising:
    a heat exchanger system coupled to the outbound coolant tubing and the inbound coolant tubing, the heat exchanger system supplying the coolant to the inbound coolant tubing and receiving the coolant from the outbound coolant tubing to remove thermal energy from the coolant.

12. The apparatus of claim 10, further comprising:
a coolant supplier coupled to the inbound coolant tubing to supply the coolant at a first temperature range; and
a coolant receiver coupled to the outbound coolant tubing to receive the coolant at a second temperature range that is higher than the temperature range.

13. The apparatus of claim 1, further comprising:
the gain medium which is a right circular cylinder-shaped crystal or an optical fiber.

14. The apparatus of claim 13, further comprising:
a filler material with high thermal conduction that fills a gap of space between the gain medium, the first manifold and the second manifold.

15. A thermal energy transfer apparatus that removes thermal energy from a gain medium of a laser system, the apparatus comprising:
a silicon-based first manifold having first internal coolant flow channels therein, the first manifold having a first primary side and a second primary side opposite the first primary side with the first internal coolant flow channels fluidly connect the first primary side and the second primary side of the first manifold, the second primary side of the first manifold having a first groove; and
a silicon-based second manifold having second internal coolant flow channels therein, the second manifold having a first primary side and a second primary side opposite the first primary side with the second internal coolant flow channels fluidly connecting the first primary side and the second primary side of the second manifold, the second primary side of the second manifold having a second groove, wherein:
when the first manifold and the second manifold are coupled together with the second primary side of the first manifold facing the second primary side of the second manifold, a first through hole configured to receive the gain medium is formed between the first manifold and the second manifold, and the first internal coolant flow channels in the first manifold and the second internal coolant flow channels in the second manifold surround the first through hole.

16. The apparatus of claim 15, wherein at least three locations on the gain medium are in physical contact with the first manifold and the second manifold when the gain medium is received in the first through hole.

17. The apparatus of claim 15, wherein the first through hole has a generally hexagonal cross section when viewed along the longitudinal axis of the gain medium.

18. The apparatus of claim 15, further comprising:
a first conduit element; and
a second conduit element, wherein:
the first and second conduit elements are coupled between the first manifold and the second manifold to provide flow paths for a coolant to flow from the second manifold to the first manifold,
when the first conduit element and the second conduit element are coupled between the first manifold and the second manifold with the second primary side of the first manifold facing the second primary side of the second manifold, a second through hole configured to receive the gain medium is formed between the first manifold, the second manifold, the first conduit element and the second conduit element, and the second through hole has a generally octagonal cross section when viewed along a longitudinal axis of the gain medium.

19. The apparatus of claim 18, wherein at least one of the first conduit element or the second conduit element is made of a metal-based or ceramic material.

20. The apparatus of claim 18, further comprising:
a layer of synthetic diamond between and in contact with the gain medium and either or both of the first manifold and the second manifold; or
a plurality of nanotubes between and in contact with the gain medium and either or both of the first manifold and the second manifold.

* * * * *